(12) United States Patent
Kanayama et al.

(10) Patent No.: US 7,385,792 B2
(45) Date of Patent: Jun. 10, 2008

(54) ELECTRONIC CONTROL APPARATUS

(75) Inventors: Mitsuhiro Kanayama, Anjo (JP); Toru Itabashi, Anjo (JP)

(73) Assignee: Denso Corporation, Kariya, Aichi-pref. (JP)

( * ) Notice: Subject to any disclaimer, the term of this patent is extended or adjusted under 35 U.S.C. 154(b) by 427 days.

(21) Appl. No.: 10/928,172

(22) Filed: Aug. 30, 2004

(65) Prior Publication Data

US 2005/0047032 A1   Mar. 3, 2005

(30) Foreign Application Priority Data

Aug. 29, 2003  (JP)  ............... 2003-307330
Jun. 28, 2004  (JP)  ............... 2004-190076

(51) Int. Cl.
*H02H 7/00* (2006.01)

(52) U.S. Cl. ............... 361/18; 361/760; 361/763; 361/761; 361/780; 361/781; 361/782; 361/783; 361/790; 361/791; 361/792; 361/793; 361/794; 361/795; 361/775; 361/777; 174/260; 174/262; 174/16.2

(58) Field of Classification Search ............... 361/18, 361/760, 763, 761, 780–783, 790–795, 748–749, 361/862, 826, 775, 777; 174/262, 260, 16.2
See application file for complete search history.

(56) References Cited

U.S. PATENT DOCUMENTS

| | | | |
|---|---|---|---|
| 5,021,727 A | 6/1991 | Mashino | |
| 5,483,110 A * | 1/1996 | Koide et al. | ............... 307/147 |
| 6,075,403 A | 6/2000 | Ishikawa et al. | |
| 6,480,396 B2 * | 11/2002 | Ninomiya | ............... 361/780 |
| 6,529,385 B1 * | 3/2003 | Brady et al. | ............... 361/766 |
| 6,557,154 B1 * | 4/2003 | Harada et al. | ............... 716/11 |
| 6,596,948 B1 * | 7/2003 | Haden et al. | ............... 174/262 |
| 2002/0186552 A1 * | 12/2002 | Kimura et al. | ............... 361/763 |
| 2003/0076197 A1 * | 4/2003 | Novak et al. | ............... 333/136 |
| 2003/0142569 A1 * | 7/2003 | Forbes | ............... 365/214 |

FOREIGN PATENT DOCUMENTS

| | | |
|---|---|---|
| JP | 1-185197 | 7/1989 |
| JP | 10-225101 | 8/1998 |
| JP | 11-150343 | 6/1999 |
| JP | 2000-91785 | 3/2000 |

* cited by examiner

*Primary Examiner*—Tuan T. Dinh
*Assistant Examiner*—Hoa C Nguyen
(74) *Attorney, Agent, or Firm*—Nixon & Vanderhye P.C.

(57) ABSTRACT

An electronic control apparatus includes an exclusive power source line for a charge pump circuit which is discriminated from a common power source line. The exclusive power source line is connected to the common power source wiring via a via-hole va having an impedance larger than that of the exclusive source line. Similarly, the electronic control apparatus includes an exclusive ground line for the charge pump circuit which is discriminated from a common ground line. The exclusive ground line is connected to the common ground via an additional via-hole vb. Furthermore, a noise-suppressing capacitor C is connected between the exclusive power source and around lines.

44 Claims, 14 Drawing Sheets

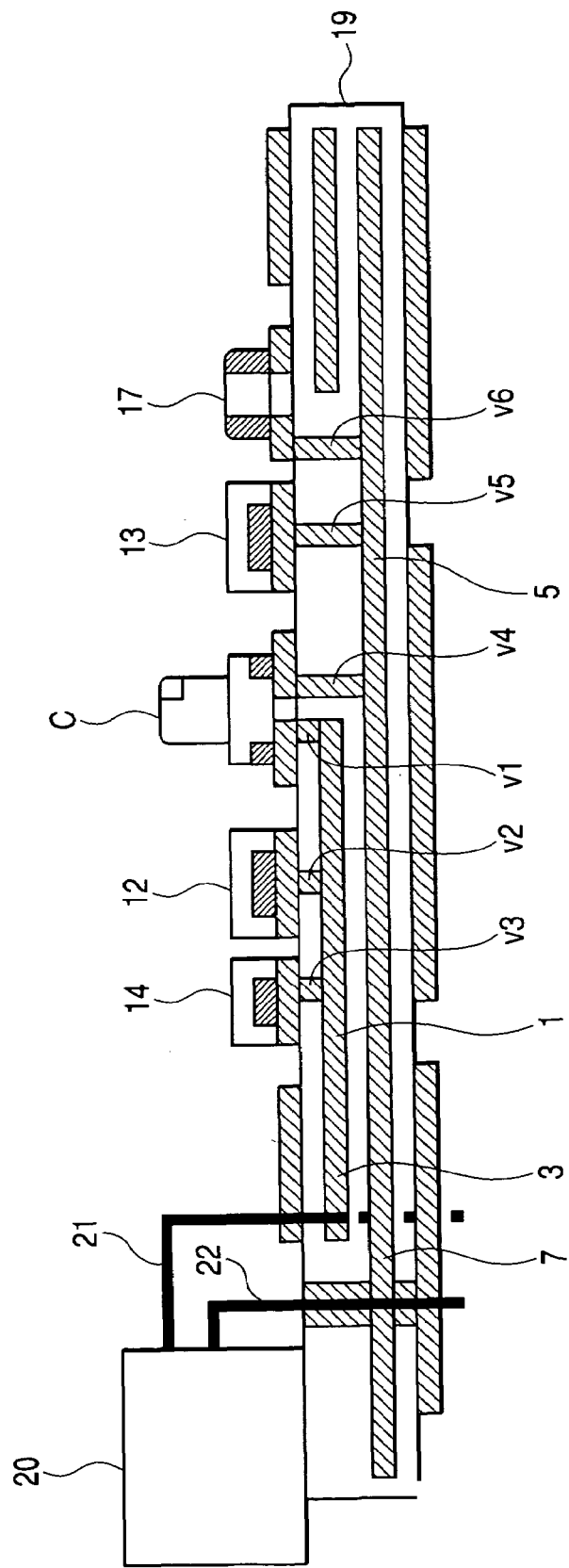

ELECTRONIC CONTROL APPARATUS

CROSS REFERENCE TO RELATED APPLICATION

This application is based on and incorporates herein by reference Japanese Patent Applications No. 2003-307330 filed on Aug. 29, 2003 and No. 2004-190076 filed on Jun. 28, 2004.

BACKGROUND OF THE INVENTION

The present invention relates to an electronic control apparatus, and more particularly to an electronic control apparatus equipped with a drive circuit for selectively controlling electric power supply to a driving objective.

According to a conventional electronic control apparatus, a switching type drive circuit is installed to selectively control electric power supply to a driving objective, such as an electronic element or an electric load, by turning on and off a switching element.

For example, the Japanese patent No. 2572408 or the Japanese patent No. 3368783 discloses a charge pump (charge-up) circuit for producing a high voltage by charging/discharging a capacitor. Another conventional drive circuit is, for example, a switching regulator (switching type power source circuit), or an electric load drive circuit for selectively driving an external electric load.

Especially, according to an electronic control apparatus, there is the tendency that electric power consumption increases in accordance with highly advanced functions. In this respect, adoption of a switching type drive circuit is effective in reducing the electric power loss. Meanwhile, an advanced electronic control apparatus incorporates numerous and various circuits.

In view of effectively installing numerous components, it is preferable to use a multilayered laminated printed board having as a plurality of wiring layers.

According to a switching type drive circuit, the current flows in a power supply path extending from the power source wiring to the ground wiring with a steep change in the rising-up or falling-down stage.

When such a pulse current is large and periodic, electromagnetic waves will be emitted as noises resulting from current changes from the wiring pattern of a printed board which serves as the power supply path of an electronic control apparatus, or from the wire harness of a power supply path which serves as the power supply path existing outside the electronic control apparatus. For example, in an automotive vehicle, the electromagnetic waves will give adverse effects to a radio or other electric wave receiving devices installed on this automotive vehicle. Furthermore, the electromagnetic waves will give adverse effects to other circuits in the electronic control apparatus.

SUMMARY OF THE INVENTION

In view of the above-described problems, the present invention has an object to effectively reduce the noises generating in response to the switching operations of the drive circuit in an electronic control apparatus.

In order to accomplish the above and other related objects, the present invention provides an electronic control apparatus equipped with a drive circuit for selectively controlling electric power supply to a driving objective. According to this electronic control apparatus, the drive circuit has an exclusive power source wiring discriminated from a common power source wiring supplying electric power to each circuit of the electronic control apparatus. The exclusive power source wiring and the common power source wiring are connected via a connecting means having an impedance larger than that of the exclusive power source wiring. And, a capacitive element is connected between the exclusive power source wiring and the drive circuit.

According to an exemplary electronic control apparatus, the exclusive power source wiring of the drive circuit and the common power source wiring of the electronic control apparatus are connected with the connecting means having an impedance larger than that of the exclusive power source wiring. This is effective in suppressing the steep current change being directly transmitted to the common power source wiring of the electronic control apparatus when the switching operation of the drive circuit is performed. The current change in the common power source wiring is moderate. Furthermore, according to the electronic control apparatus of this invention, a capacitive element is connected between the exclusive power source wiring and the ground wiring of the drive circuit at the downstream side of the connecting means. Accordingly, the large current temporarily flowing in an initial condition is mainly supplied from the capacitive element. In other words, the current change in the common power source wiring is moderate.

Accordingly, it becomes possible to effectively reduce the noises transmitted to the external devices or to other circuits of the electronic control apparatus when the switching operation of the drive circuit is performed. There is the tendency that advanced electronic control apparatuses have an increased number of internal circuits.

To efficiently incorporate these components, it is preferable that the electronic control apparatus is formed on a multilayered laminated printed board and each of the wirings is a wiring pattern of the laminated printed board.

When the laminated printed board is used, it is preferable that the exclusive power source wiring is formed on a surface layer of the laminated printed board. The switching current (i.e. the current largely changing in response to a switching operation of the drive circuit) flows only in the surface wiring layer. This is effective in reducing the impedance of a path along which the switching current flows. In other words, the switching current easily flows.

In this case, it is preferable that a portion of the common power source wiring connected to the exclusive power source wiring via at least the connecting means is formed in an inner layer of the laminated printed board, and the connecting means is a via-hole of the laminated printed board. The via-hole has an impedance higher than that of the wiring pattern on a printed board. When the via-hole is used, it becomes possible to easily provide a connecting means having an impedance larger than that of the exclusive power source wiring of the drive circuit.

On the other hand, when a laminated printed board is used, it is preferable that a portion of the common power source wiring connected to the exclusive power source wiring via at least the connecting means is formed in one layer of the laminated printed board. And, a portion of the exclusive power source wiring connected to the common power source wiring via at least the connecting means is formed in another layer of the laminated printed board. In this case, a preferable connecting means is a via-hole of the laminated printed board.

In this case, it is preferable that the exclusive power source wiring is formed in a wiring layer closer to a surface of the laminated printed board on which the capacitive element is mounted, compared with the portion of the common power source wiring connected to the exclusive power source wiring via the connecting means. This is effective in obtaining an appropriate impedance difference (i.e. obtaining the relationship "impedance of exclusive power source wiring<impedance of connecting means").

Furthermore, it is preferable that the via-hole serving as the connecting means is a through-hole into which a lead terminal of a component other than both the capacitive element and a component of the drive circuit is inserted.

According to this electronic control apparatus, it is not necessary to provide a special exclusive via-hole serving as the connecting means. This is effective in realizing the space-saving and cost-reduction of the printed board. Regarding the component for which the lead terminal insertion through-hole is usable as the connecting means, it should be robust against the current change in the power source wiring.

Furthermore, it is preferable that the via-hole serving as the connecting means is a through-hole into which a lead terminal of the capacitive element is inserted.

When the capacitive element is a lead component (i.e. an insert-type component having a lead terminal), the lead terminal of the capacitive element is inserted into a through-hole. Thus, it is possible to use the through-hole as the connecting means. According to this electronic control apparatus, it is not necessary to provide a special exclusive via-hole serving as the connecting means. This is effective in realizing the space-saving and cost-reduction of the printed board. Furthermore, it is possible to obtain the above-described appropriate impedance difference.

Furthermore, it is preferable that the ground wiring of the drive circuit is an exclusive ground wiring discriminated from a common ground wiring regulating a ground potential of each circuit in the electronic control apparatus. The exclusive ground wiring and the common ground wiring are connected via additional connecting means having an impedance larger than that of the exclusive ground wiring. And, the capacitive element is connected between the exclusive power source wiring and the exclusive ground wiring.

According to this arrangement, like the power source wiring, the ground wiring of the electronic control apparatus is separated into one ground wiring common to all of the circuits and another ground wiring exclusively provided for the drive circuit. The common ground wiring and the exclusive ground wiring are connected to each other with additional connecting means. The additional connecting means has an impedance larger than that of the exclusive ground wiring. The capacitive element is connected between the exclusive ground wiring and the exclusive power source wiring.

According to the electronic control apparatus having the above arrangement, it is possible to prevent a steep current change from being directly transmitted to the common ground wiring in the electronic control apparatus even when such a steep current change occurs in response to the switching operation of the drive circuit. Therefore, the current change in the common ground wiring is moderate.

There is a case that a steep current change occurs in an external wiring connecting the ground terminal of the electronic control apparatus (i.e. a terminal to which the ground wiring is connected) and a lower potential side (i.e. a negative terminal side) of an external power source. In this case, the noise resulting from the steep current change may give adverse effects to an external device (for example, when the impedance of the external wiring is relatively large). In such a case, adopting the above-described arrangement is effective in reducing the noise. It is possible to surely reduce the noises which give adverse influence to the external device or to other circuits in the electronic control apparatus even if such noises occur in response to the switching operation in the drive circuit.

Furthermore, it is preferable that the ground wiring of the drive circuit is an exclusive ground wiring discriminated from a common ground wiring regulating a ground potential of each circuit in the electronic control apparatus. The exclusive ground wiring and the common ground wiring are connected via additional connecting means having the impedance larger than that of the exclusive ground wiring. And, the capacitive element is connected between the exclusive power source wiring and the exclusive ground wiring.

According to this electronic control apparatus, in addition to the effect of using the multilayered substrate (i.e. the effect of efficiently mounting numerous components), it is possible to prevent a steep current change from being directly transmitted to the common ground wiring in the electronic control apparatus even when such a steep current change occurs in response to the switching operation of the drive circuit. Therefore, the current change in the common ground wiring is moderate. Furthermore, it is possible to surely reduce the noises which give adverse influence to the external device or other circuits in the electronic control apparatus even if such noises occur in response to the switching operation in the drive circuit.

According to the above-described electronic control apparatus, the exclusive ground wiring is formed in a surface layer of the laminated printed board. The switching current (i.e. the current largely changing in response to a switching operation of the drive circuit) flows only in the surface wiring layer. This is effective in reducing the impedance of a path along which the switching current flows. In other words, the switching current easily flows.

According to the above-described electronic control apparatus, it is preferable that additional connecting means is a via-hole of the laminated printed board when a portion of the common ground wiring connected to the exclusive ground wiring via at least additional connecting means is formed in an inner layer of the laminated printed board. It becomes possible, at a low cost, to provide additional connecting means having the impedance larger than that of the exclusive ground wiring of the drive circuit.

Furthermore, according to the above-described electronic control apparatus, it is preferable that a portion of the common ground wiring connected to the exclusive ground wiring via at least additional connecting means is formed in one layer of the laminated printed board. And, a portion of the exclusive ground wiring connected to the common ground wiring via at least additional connecting means is formed in another layer of the laminated printed board. In this case, it is preferable that additional connecting means is a via-hole of the laminated printed board.

In this case, it is preferable that the exclusive ground wiring is formed in a wiring layer closer to a surface of the laminated printed board on which the capacitive element is mounted, compared with the portion of the common ground wiring connected to the exclusive ground via the connecting means. This is effective in obtaining an appropriate impedance difference (i.e. obtaining the relationship "impedance of exclusive ground wiring<impedance of additional connecting means").

Furthermore, it is preferable that the via-hole serving as additional connecting means is a through-hole into which a lead terminal of a component other than both the capacitive element and a component of the drive circuit is inserted. According to this electronic control apparatus, it is not necessary to provide a special exclusive via-hole serving as the connecting means. This is effective in realizing the space-saving and cost-reduction of the printed board. Regarding the component for which the lead terminal insertion through-hole is usable as the connecting means, it should be robust against the current change in the ground wiring.

Furthermore, it is preferable that the via-hole serving as additional connecting means is a through-hole into which a lead terminal of the capacitive element is inserted.

When the capacitive element is a lead component, the through-hole into which the lead terminal of the capacitive element is inserted can be used as additional connecting means. According to this electronic control apparatus, it is not necessary to provide a special exclusive via-hole serving as the additional connecting means. This is effective in realizing the space-saving and cost-reduction of the printed board. Furthermore, it is possible to obtain the above-described appropriate impedance difference.

Regarding the connecting means for connecting the exclusive power source wiring and the common power source wiring, it is preferable to use a resistance element. When a resistance element is used as the connecting means, it is possible to set the impedance to a higher level which is unattainable by a via-hole. Thus, the resistance element is preferably used when it is necessary to promptly supply the current to a driving object. Furthermore, it is possible to adjust the impedance of the resistance element with reference to the condition of a printed board even after this printed board is accomplished.

Furthermore, it is preferable that the connecting means is an inductance element. Using the inductance element as the connecting means is advantageous because the impedance of the inductance element can be set to a higher level which is unattainable by a via-hole and because the impedance of the inductance element can be adjusted with reference to the condition of a printed board even after this printed board is accomplished. Furthermore, compared with the resistance element, using the inductance element is advantageous in suppressing the voltage drop in this element. The inductance element is preferably used when the ordinary current supply amount (i.e. the current amount stationarily flowing from the common power source wiring to the exclusive power source wiring) is large.

Regarding the additional connecting means for connecting the exclusive ground wiring and the common ground wiring, it is preferable to use a resistance element.

Furthermore, it is preferable to use an inductance element as the additional connecting means.

Regarding the relationship between the exclusive power source wiring and the connecting means, it is preferable that the impedance of the connecting means is 1.1 times or more the impedance of the exclusive power source wiring. More specifically, the impedance of the exclusive power source wiring represents the impedance of a path connecting the capacitive element to respective components of the drive circuit in the exclusive power source wiring. When the impedance of the connecting means is 1.1 times (preferably 1.5 times) or more the impedance of the exclusive power source wiring, the noise can be reduced to a preferable level and the reduction effect will be confirmed by a general noise measuring device.

Similarly, regarding the relationship between the exclusive ground wiring and the additional connecting means, it is preferable that the impedance of additional connecting means is 1.1 times or more the impedance of the exclusive ground wiring. More specifically, the impedance of the exclusive ground wiring represents the impedance of a path connecting the capacitive element to respective components of the drive circuit in the exclusive ground wiring. When the impedance of the additional connecting means is 1.1 times (preferably 1.5 times) or more the impedance of the exclusive ground wiring, the noise can be reduced to a preferable level and the reduction effect will be confirmed by a general noise measuring device.

Regarding the relationship between the exclusive power source wiring and the common power source wiring, it is preferable that a wiring area of the exclusive power source wiring is 0.5 times or less a wiring area of the common power source wiring. When the wiring area of the exclusive power source wiring is 0.5 times or less the wiring area of the common power source wiring, it is possible to efficiently mount numerous components on a printed board. Furthermore, the distance between the capacitive element and respective components of the drive circuit can be reduced. Accordingly, the impedance of the exclusive power source wiring can be reduced.

Similarly, regarding the relationship between the exclusive ground wiring and the common ground wiring, it is preferable that a wiring area of the exclusive ground wiring is 0.5 times or less a wiring area of the common ground wiring.

Furthermore, the electronic control apparatus of this invention is preferable used when the drive circuit repetitively starts or stops electric power supply to the driving object, in view of suppressing the noises frequently occurring in response to repetitive current changes.

Furthermore, the electronic control apparatus of this invention is preferable used when the driving object has a capacitive component, in view of suppressing a large current change occurring when the power supply to this driving object is started. In this case, for example, the driving object is a charging/discharging capacitor of a charge pump circuit.

For example, the drive circuit is a step-up switching mode power source circuit that produces a boosted voltage higher than a power source voltage supplied via the exclusive power source wiring. Alternatively, the drive circuit is a step-down switching mode power source circuit that produces a reduced voltage lower than a power source voltage supplied via the exclusive power source wiring. Moreover, the drive circuit is an electric load drive circuit that controls an electric load provided outside the electronic control apparatus which serves as the driving object. When the drive circuit is the power source circuit or the electric load drive circuit, not only the instant current is large but also the steady supply current is large. Accordingly, using the inductance element as the connecting means or the additional connecting means is effective.

For example, the electric load drive circuit is a low-side drive circuit, according to which one end of the electric load is connected to the exclusive power source wiring, and the drive circuit supplies electric power to the electric load under a condition that the other end of the electric load is connected to a ground wiring of the drive circuit via a switching element. Alternatively, the electric load drive circuit is a high-side drive circuit, according to which one end of the electric load is connected to a ground wiring of the drive circuit, and the drive circuit supplies electric power to the electric load under a condition that the other end of the electric load is connected to the exclusive power source wiring via a switching element. Moreover, the electric load drive circuit is a half-bridge circuit or a full-bridge circuit, according to which the drive circuit includes a higher potential side switching element connecting one end of the electric load to the exclusive power source wiring, and a lower potential side switching element connecting the other end of the electric load to a ground wiring of the drive circuit, and the drive circuit controls electric power supply to the electric load by using these switching elements.

Moreover, the present invention provides an electronic control apparatus for a vehicle including a circuit board. The circuit board has a circuit portion and a drive circuit portion. A common power source wiring is formed in the circuit board for supplying electric power to the circuit portion. An exclusive power source wiring is formed in the circuit board for supplying electric power to the drive circuit portion. A connecting member is formed in the circuit board and disposed between the common power source wiring and the exclusive power source wiring. The connecting member has electric conductivity for electrically connecting the common power source wiring and the exclusive power source wiring. The connecting member further has the impedance larger than those of the common power source wiring and the exclusive power source wiring. A capacitive element is disposed between the drive circuit portion and the connecting member. One terminal of the capacitive element is connected to the exclusive power source wiring, and the other terminal of the capacitive element is connected to a ground wiring for the drive circuit portion.

BRIEF DESCRIPTION OF THE DRAWINGS

The above and other objects, features and advantages of the present invention will become more apparent from the following detailed description which is to be read in conjunction with the accompanying drawings, in which:

FIG. 16 is a cross-sectional view showing a printed board of an electronic control apparatus including the charge pump circuit shown in FIG. 15A.

DESCRIPTION OF THE PREFERRED EMBODIMENTS

Preferred embodiments of the present invention will be explained hereinafter with reference to attached drawings.

The mechanism of noise generation will be explained with reference to a charge pump circuit having a fundamental drive circuit.

Figure 15A:
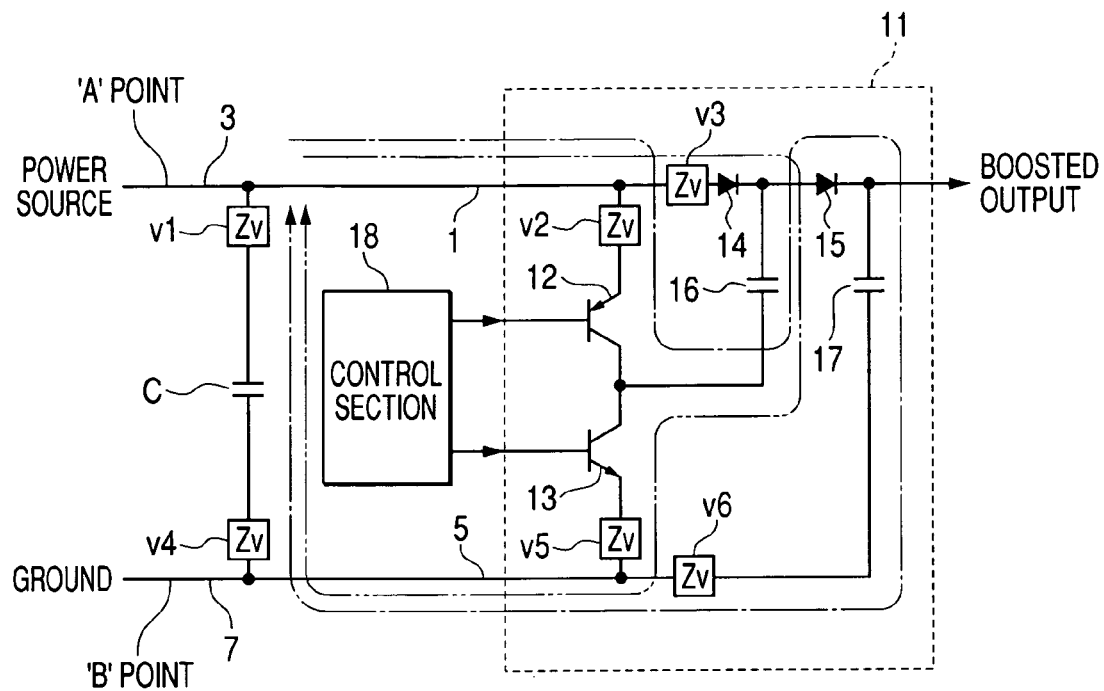
FIGS. 15A and 15B are diagrams explaining the fundamental arrangement and functions of a charge pump circuit.
Figure 15B:
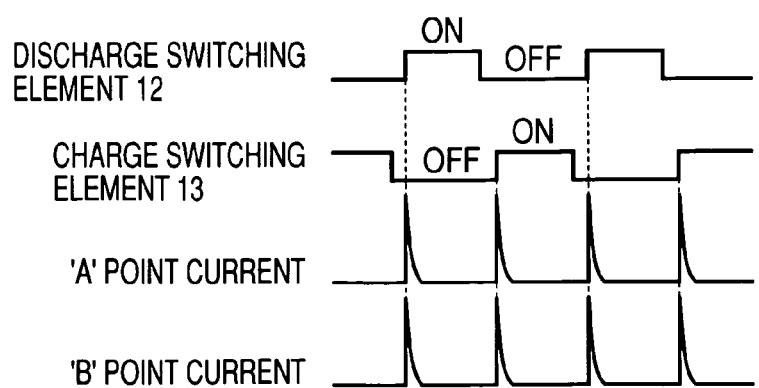

FIG. 15A is a circuit diagram showing an arrangement of a charge pump circuit 11. FIG. 15B is a time chart showing the operation of the charge pump circuit 11. FIG. 16 is a cross-sectional view showing a printed board 19 of an electronic control apparatus equipped with the charge pump circuit 11. According to this embodiment, the printed board 19 is a 4-layer substrate consisting of four laminated wiring layers. The wiring of each circuit shown in FIG. 15A is formed by the wiring pattern of the printed board 19.

As shown in FIG. 15A, the charge pump circuit 11 includes a discharge switching element 12, a charge switching element 13, an input-side reverse-current preventing diode 14, an output-side reverse-current preventing diode 15, a step-up capacitor (i.e. charge pump capacitor) 16, and an output capacitor 17. The discharge switching element 12 is arranged by a PNP transistor which has an emitter connected to a power source wiring 1 from which a power source voltage is applied. The charge switching element 13 is arranged by an NPN transistor which has an emitter connected to a ground wiring 5 and a collector connected to a collector of the discharge switching element 12. The input-side reverse-current preventing diode 14 has an anode connected to the power source wiring 1. The output-side reverse-current preventing diode 15 has an anode connected to a cathode of the diode 14. The step-up capacitor (i.e. charge pump capacitor) 16 is connected between a common collector of the switching elements 12 and 13 and the cathode of the diode 14. The output capacitor 17 is connected between the cathode of the diode 15 and the ground wiring 5 to produce a step-up voltage.

Each of the switching elements 12 and 13 selectively turns on and off at predetermined timings in response to the control signal supplied from the control section 18 as shown in FIG. 15B.

More specifically, according to this charge pump circuit 11, the capacitor 16 is charged when the discharge switching element 12 is turned off and the charge switching element 13 is turned on, because the current flows along the path consisting of power source wiring 11 diode 14 to capacitor 16 to charge switching element 13 to ground wiring 5 as indicated by the arrow of an alternate long and two short dashes line in FIG. 15A. On the other hand, the capacitor 16 is discharged and the capacitor 17 is charged when the discharge switching element 12 is turned on and the charge switching element 13 is turned off, because the current flows along the path consisting of power source wiring 1 to discharge switching element 12 to capacitor 16 to diode 15 to capacitor 17 to ground wiring 5 as indicated by the arrow of an alternate long and short dash line in FIG. 15A. By repeating the above operations, the capacitor 17 accumulates the charged voltage of the capacitor 16 and as a result stores the electric charge at an electric potential higher than the power source voltage (i.e. a voltage supplied from the power source wiring 1). The voltage of capacitor 17 is output as a step-up voltage.

FIG. 15A shows a capacitor C interposed between the power source wiring 1 and the ground wiring 5 of the charge pump circuit 11.

The power source wiring 1 and the ground wiring 5 are connected to the power source wiring 3 and the ground wiring 7, respectively. The power source wiring 3 and the ground wiring 7 are common to the circuits provided in the electronic control apparatus.

If no capacitor C is provided, a large pulse current will flow from a common power source wiring 3 into the charge pump circuit 11 when the charge switching element 13 is turned on (in response to the charge of the capacitor 16), and when the discharge switching element 12 is turned on (i.e. in response to the discharge of the capacitor 16) as shown in FIG. 15B. The pulse current returns to the common ground wiring 7. Such a large current change becomes the cause of noises generating from the wire harness or the like which supplies the power source voltage to the electronic control apparatus. The noise will give adverse effects to the radio or other devices.

To eliminate the above drawback, the capacitor C is connected between the power source wiring 1 and the ground wiring 5. According to this circuit arrangement, when the switching element 12 or 13 is changed from the OFF state to the ON state, the current is supplied from the capacitor C to the power source wiring 1 of the charge pump circuit 11. This effectively prevents a rapid increase in the current flowing in the common power source wiring 3 (more specifically, the current flowing from its power source wiring 3).

In other words, when the switching element 12 or 13 is turned on, the capacitor C supplies the most of the temporarily and rapidly increasing current flowing in the charge pump circuit 11. Therefore, a relatively small amount of current will be supplied from the common power source wiring 3. This effectively prevents the generation of noises which give adverse effects to the radio or other devices installed in an automotive vehicle.

However, according to the charge pump circuit 11 shown in FIG. 15A and FIG. 16, the power source wiring 1 of this circuit 11 is not specifically discriminated from the common power source wiring 3 which extends from a power source terminal 21 of a connector 20 of the electronic control apparatus. Similarly, the ground wiring 5 of this circuit 11 is not specifically discriminated from the common ground wiring 7 which extends from a ground terminal 22 of the connector 20. A higher potential end of the capacitor C is connected via a via-hole v1 to the power source wiring 1 which is not discriminated from the common power source wiring 3. The emitter of the discharge switching element 12 and the anode of diode 14 are connected via via-holes v2 and v3 to the power source wiring 1, respectively. Furthermore, the other end of the capacitor C is connected via a via-hole v4 to the ground wiring 5 which is not discriminated from the common ground wiring 7. The emitter of the charge switching element 13 and a lower potential end of the capacitor 17 are connected via via-holes v5 and v6 to the ground wiring 5, respectively. In general, the impedance Zv of respective via-holes v1 to v6 is larger than the impedance of a wiring pattern of the printed board.

Accordingly, when the switching element 12 or 13 is turned on, no current flows across the capacitor C due to the presence of via-holes v1 and v4. Instead, the pulse current flows along the common power source wiring 3 since the impedance of the common power source wiring 3 is smaller than the impedance of the via-holes v1 and v4. This current returns to the ground wiring 7. As a result, provision of the capacitor C brings no substantial effect in reducing the noises. In FIG. 16, the wiring pattern is indicated by hatching. Furthermore, the capacitor C, the switching elements 12 and 13, the diode 14, and the capacitor 17 shown in FIG. 16 are surface-mounting type components. Each component is connected to the printed board 19 via a connecting terminal (indicated as a black portion).

Figure 1:
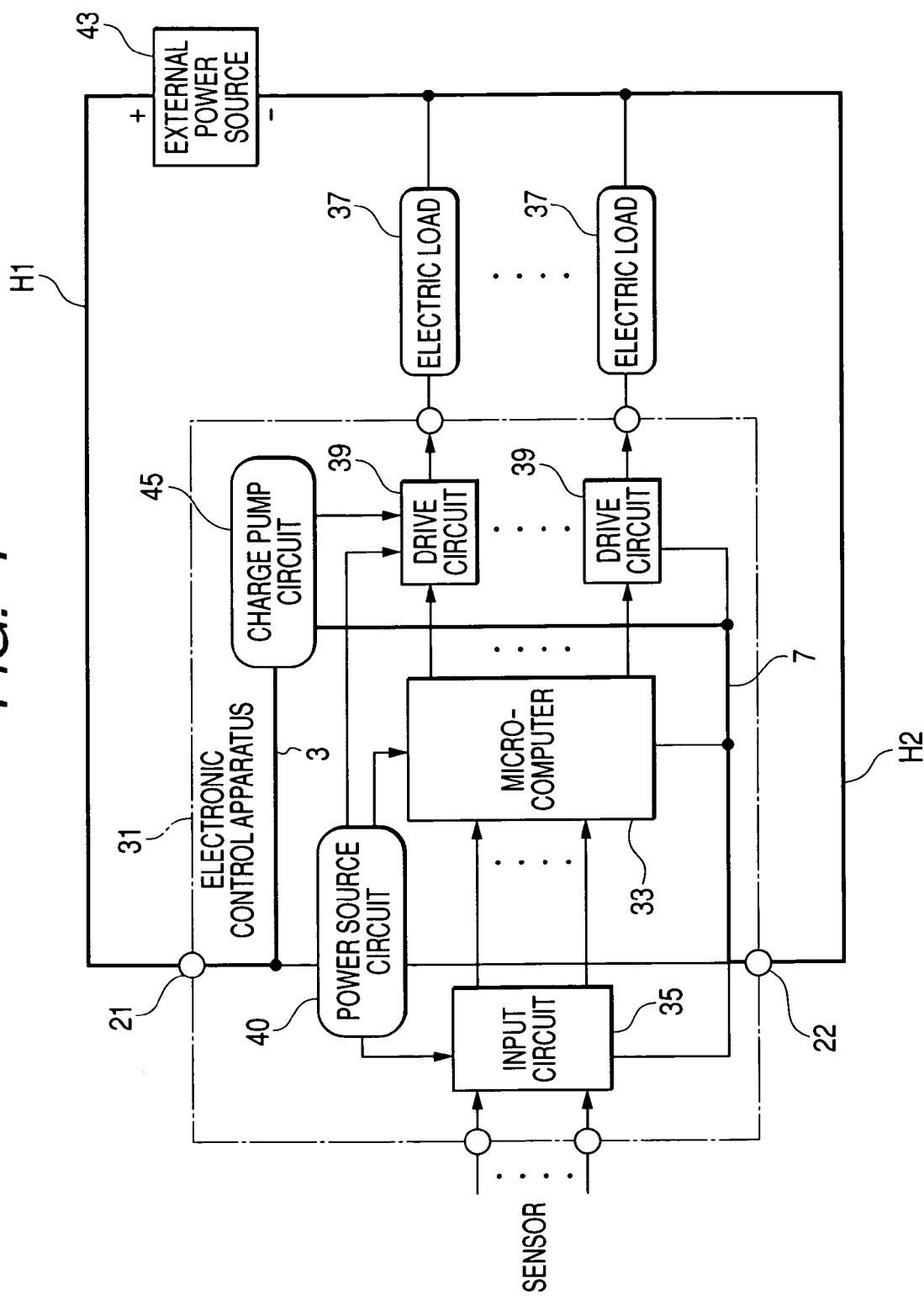
FIG. 1 is a circuit diagram showing the schematic arrangement of an electronic control apparatus in accordance with a first embodiment of the present invention.

In view of the foregoing, the present invention provides an electronic control apparatus as described hereinafter. FIG. 1 is a circuit diagram showing the schematic arrangement of an electronic control apparatus 31 in accordance with a first embodiment of the present invention, which is installed in an automotive vehicle.

As shown in FIG. 1, the electronic control apparatus 31 according to the first embodiment includes a microcomputer 33, an input circuit 35, a plurality of load drive circuits 39, and a power source circuit 40. The input circuit 35 receives sensor signals of various sensors, applies the filter processing to these signals, and supplies the filtered sensor signals to the microcomputer 33. The apparatus 31 is connected to a plurality of electric loads 37 which are provided outside this apparatus 31. Each load drive circuit 39 receives a command signal from the microcomputer 33 and drives a corresponding electric load 37 in accordance with the command signal. An external power source (e.g. vehicle battery) 43 generates a constant voltage. The power source circuit 40, receiving the constant voltage from the external power source 43, supplies electric power to the microcomputer 33, the input circuit 35, and respective load drive circuits 39.

The load drive circuit 39 includes an N-channel MOSFET (i.e. Metal Oxide Semiconductor Field Effect Transistor, although not shown in the drawing) provided at an upstream side of the electric load 37. This FET is turned on to supply electric power to the corresponding electric load 37 when the gate of FET receives a voltage higher than the power source voltage of the external power source 43. In this respect, the load drive circuit 39 is a high-side drive circuit using the N-channel MOS FET. Accordingly, the electronic control apparatus 31 includes a charge pump circuit 45 which receives the power source voltage of the external power source 43 and generates a step-up voltage higher than the power source voltage of the external power source 43. The charge pump circuit 45 supplies the step-up voltage to each load drive circuit 39 to turn on the N-channel MOS-FET.

In FIG. 1, white circles (O) represent connector terminals of the electronic control apparatus 31. A power source terminal 21 is connected to a positive terminal of the external power source 43 via an external power source wiring H1. A ground terminal 22 is connected to a negative terminal of the external power source 43 via an external ground wiring H2.

Next, the charge pump circuit 45 will be explained with reference to FIGS. 2A to 6.

Figure 2A:
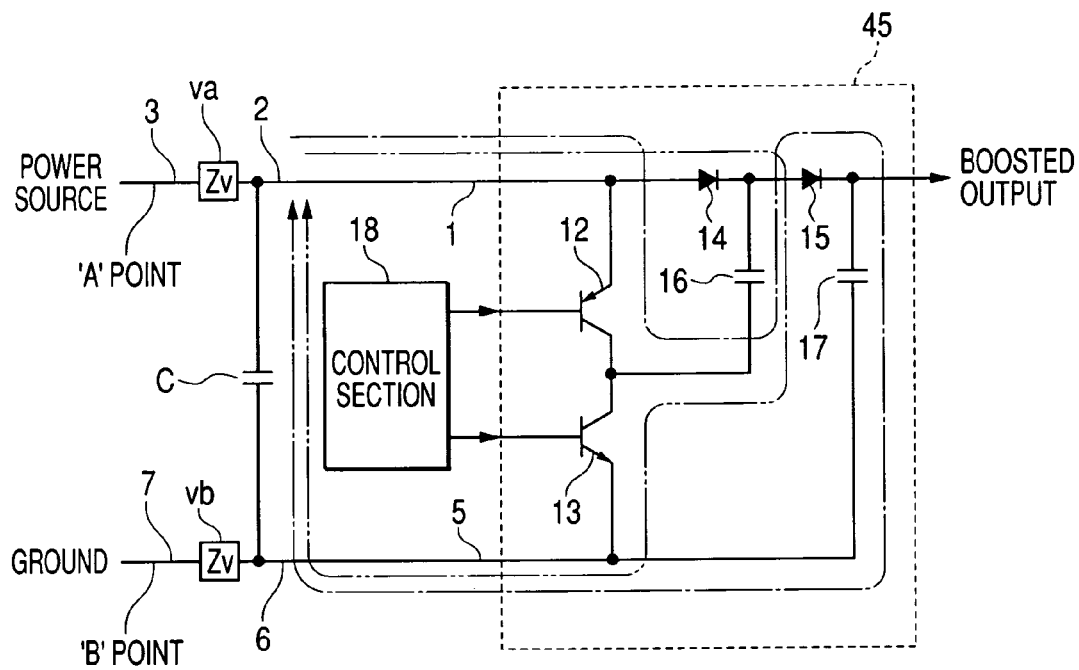
FIG. 2A is a circuit diagram showing an arrangement of a charge pump circuit provided in the electronic control apparatus according to the first embodiment of the present invention.
Figure 2B:
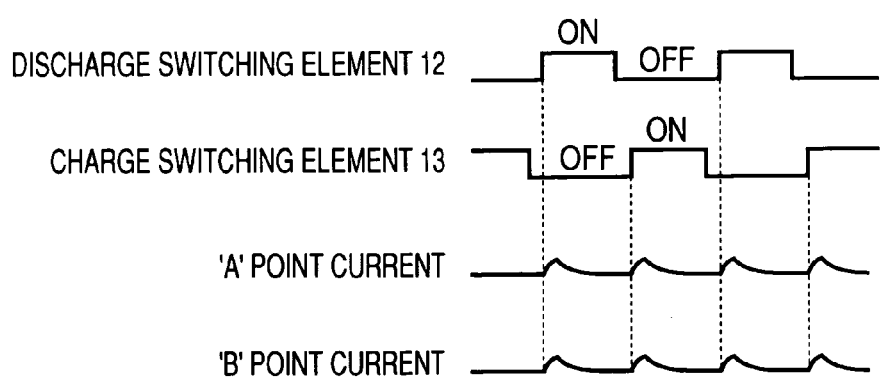
FIG. 2B is a timing diagram showing the operation of the charge pump circuit shown in FIG. 2A.
Figure 3:
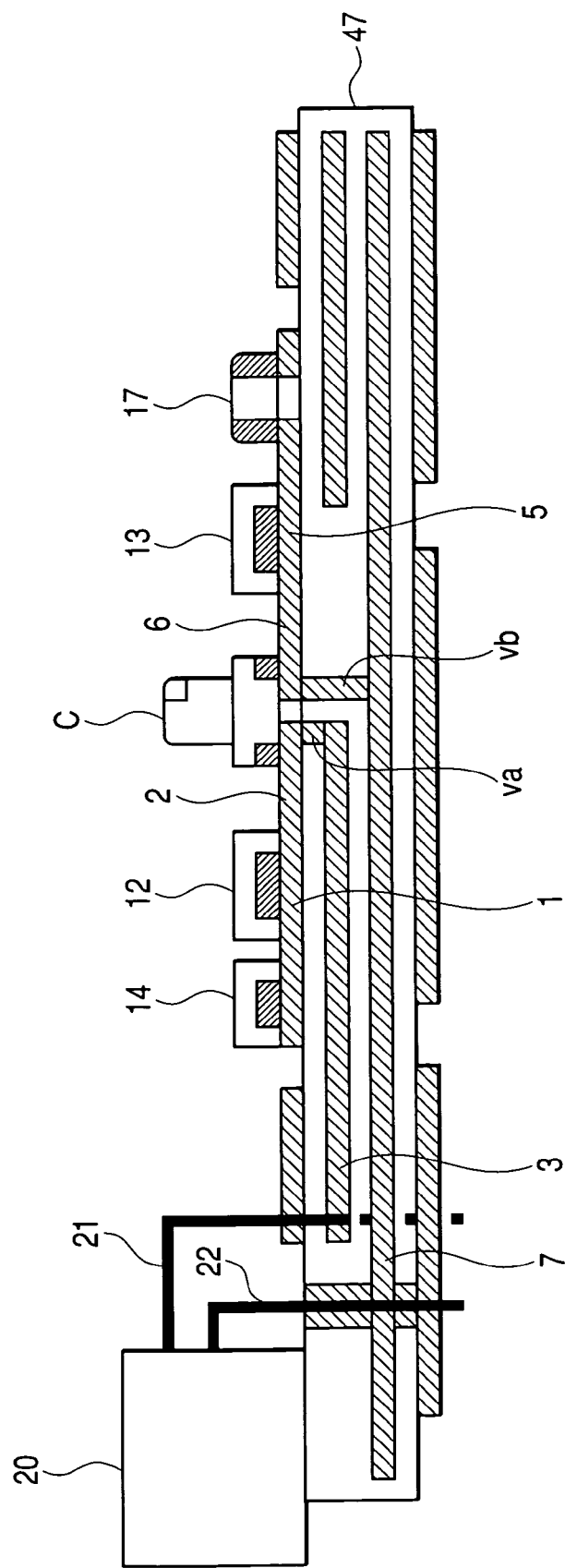
FIG. 3 is a cross-sectional view showing a printed board forming the electronic control apparatus according to the first embodiment of the present invention.
Figure 4:
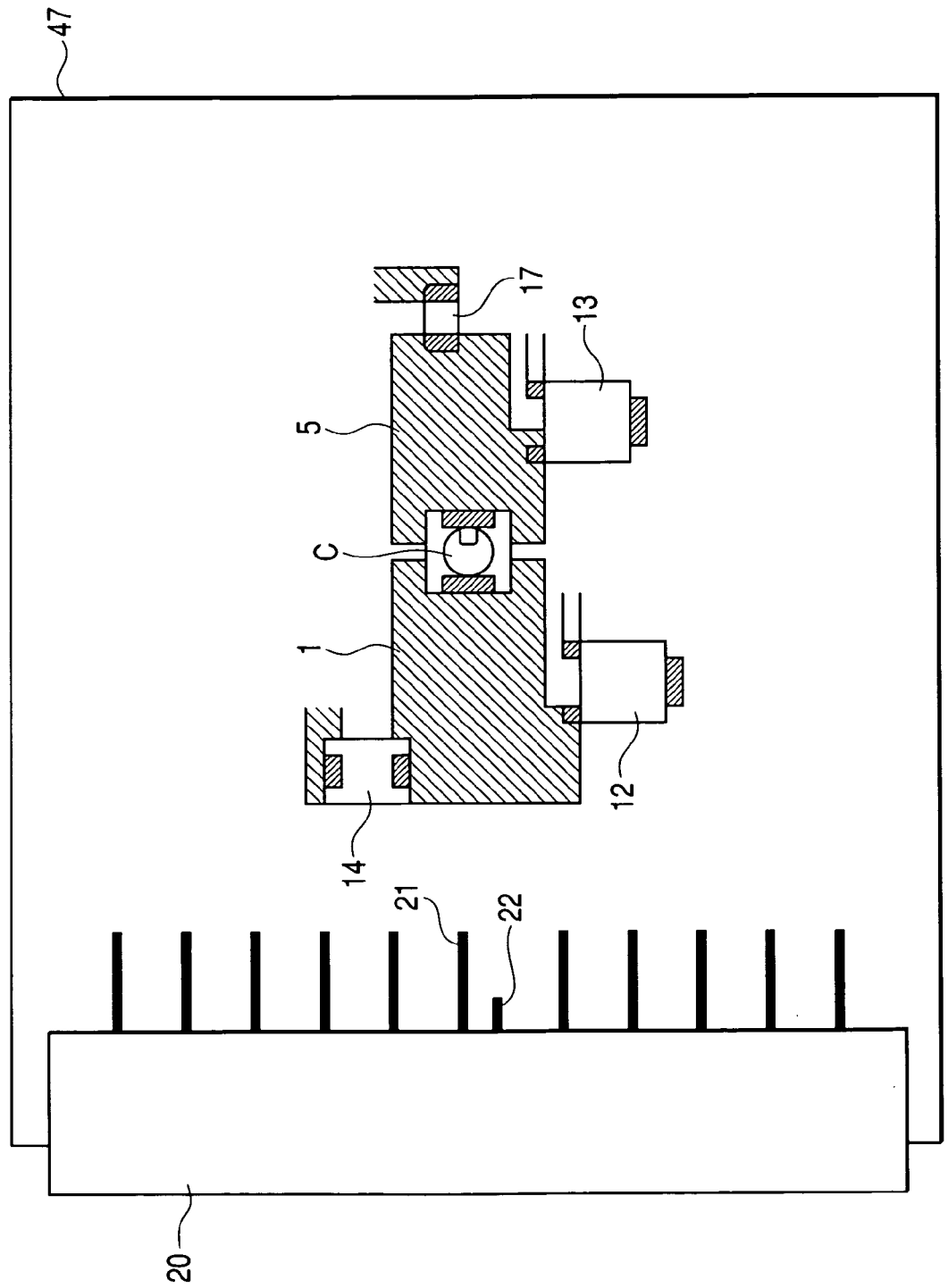
FIG. 4 is a plan view showing an upper surface of the printed board according to the first embodiment of the present invention.
Figure 5:
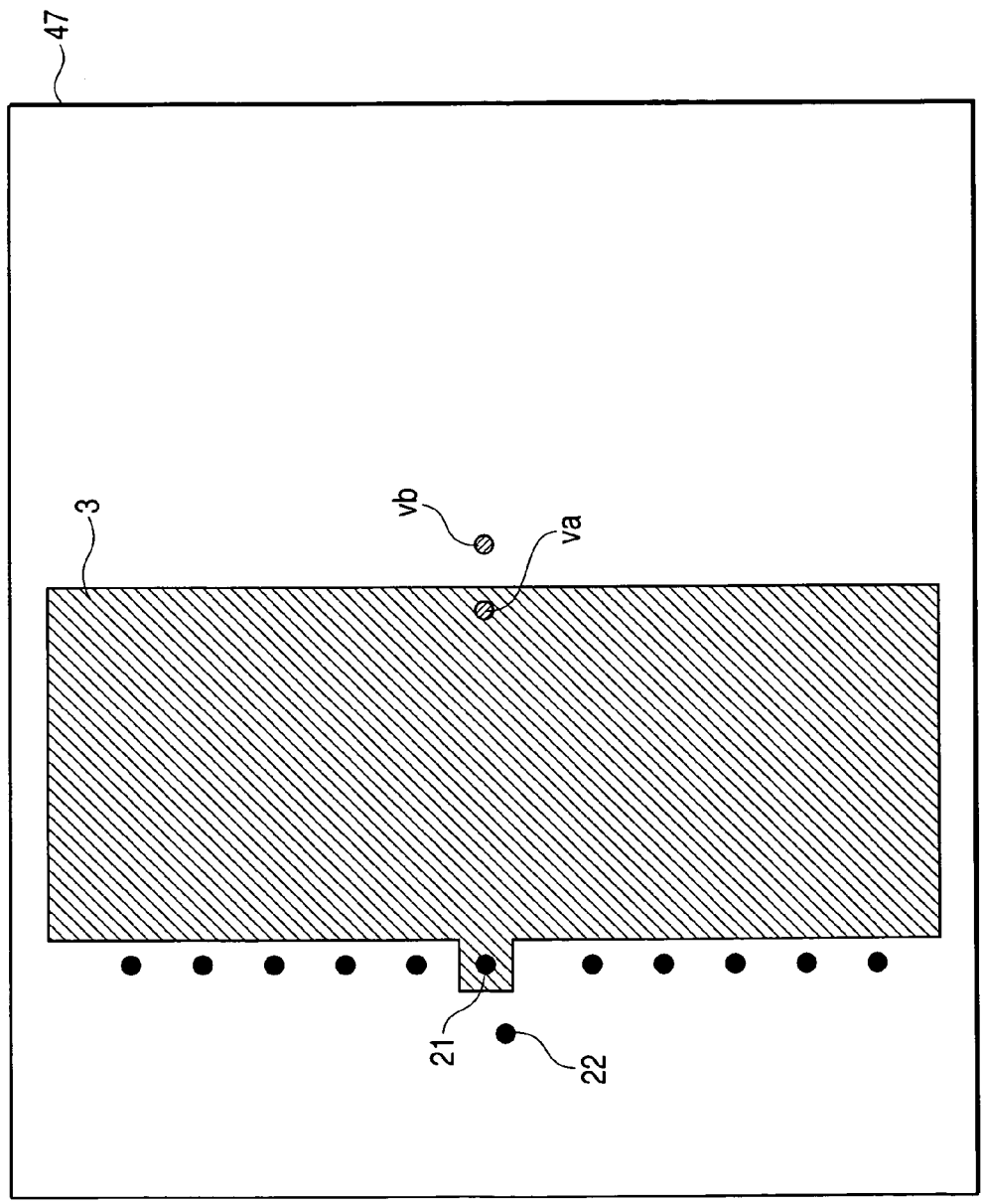
FIG. 5 is a plan view showing a second wiring layer of the printed board according to the first embodiment of the present invention.
Figure 6:
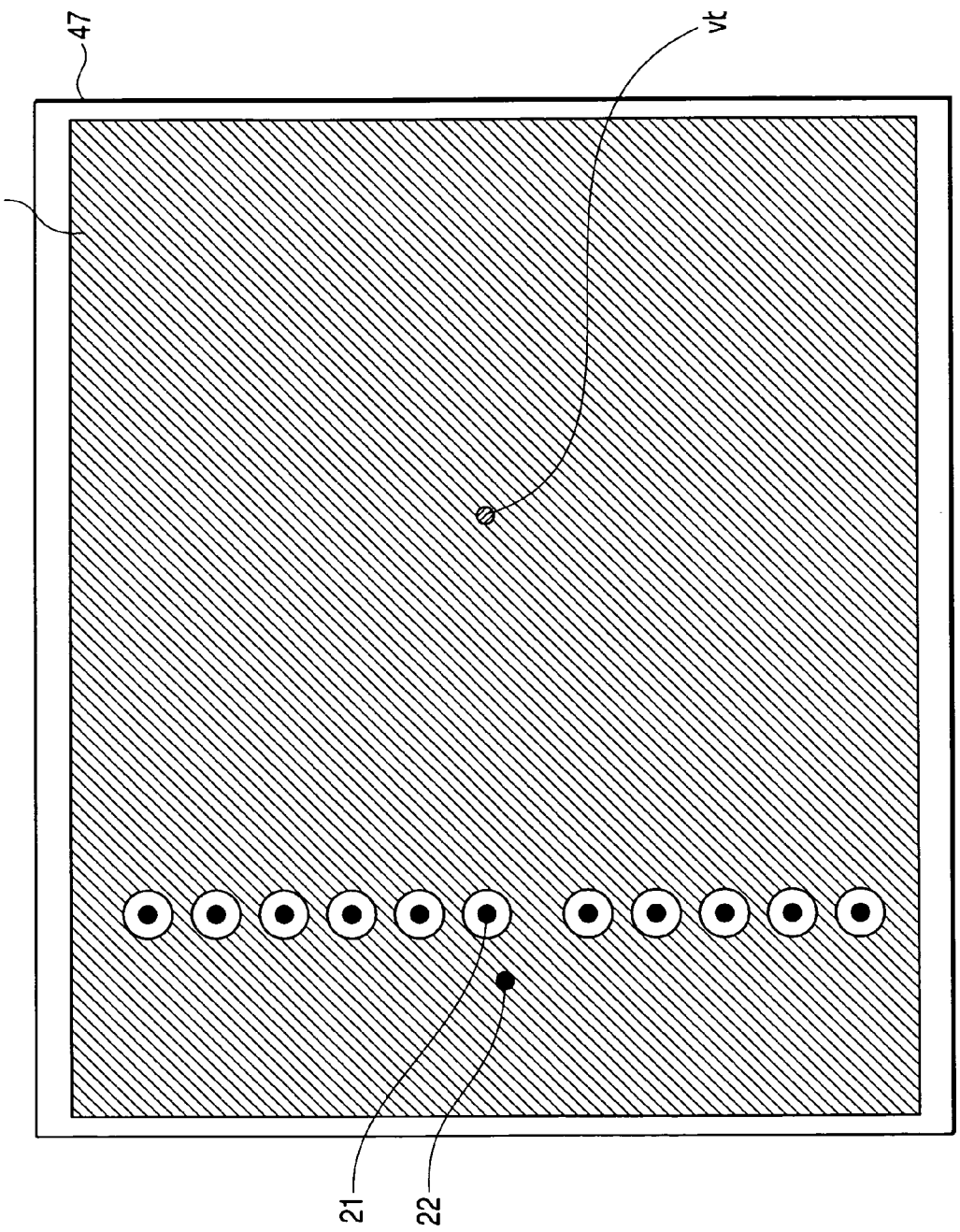
FIG. 6 is a plan view showing a third wiring layer of the printed board according to the first embodiment of the present invention.

FIG. 2A is a circuit diagram showing an arrangement of the charge pump circuit 45. FIG. 2B is a timing diagram showing the operation of the charge pump circuit 45. FIG. 3 is a cross-sectional view showing a printed board 47 forming the electronic control apparatus 31. According to the first embodiment, the printed board 47 is a multilayered substrate consisting of four laminated layers. FIG. 4 is a plan view showing an upper surface of the printed board 47 shown in FIG. 3. FIG. 5 is a plan view showing a second wiring layer of the printed board 47. The second wiring layer is closest to the surface layer (i.e. uppermost layer) of the printed board 47 (in other words, highest but one) as shown in FIG. 3. FIG. 6 is a plan view showing a third wiring layer of the printed board 47. The third wiring layer is second closest to the surface layer (i.e. uppermost layer) of the printed board 47 (in other words, highest but two) as shown in FIG. 3. The components shown in FIGS. 2A to 6, if they are identical with those shown in FIGS. 15 and 16, are denoted by using the same reference numerals.

As shown in FIG. 2A, the charge pump circuit 45 is identical in circuit arrangement with the charge pump circuit 11 shown in FIG. 15A. The discharge switching element 12 and the charge switching element 13 alternatively and repetitively turn on and off at predetermined timings in response to the control signals given from the control section 18 as shown in FIG. 2B, to charge or discharge the capacitor 16 serving as a driving object. As a result, a step-up voltage higher than the power source voltage is produced at a connecting point of a cathode of the diode 15 and the capacitor 17.

FIG. 2A shows the control section 18 as an external component associated with the charge pump circuit 45, although FIG. 1 does not show control section 18. Furthermore, FIG. 2A shows a capacitor C as another external component associated with the charge pump circuit 45, although FIG. 1 does not show the capacitor C. According to the charge pump circuit 45, in response to the turning-on action of the charge switching element 13, the current flows from the cathode of diode 14 to the collector of charge switching element 13 via the capacitor 16 along an alternate long and two short dashes line shown in FIG. 2A. Thus, the capacitor 16 is charged. On the other hand, in response to the turning-on action of the discharge switching element 12, the current flows from the collector of discharge switching element 12 to the anode of diode 15 via the capacitor 16 along an alternate long and short dashes line shown in FIG. 2A. Thus, the capacitor 16 is discharged. According to this embodiment, the charge pump circuit 45 serves as the drive circuit (i.e. switching drive circuit).

According to the electronic control apparatus 31 of the first embodiment, as shown in FIGS. 2A and 3-6, the power source wiring 1 of the charge pump circuit 45 on the printed board 47 is discriminated from the common power source wiring 3. The power source wiring 1 is a wiring pattern connecting the emitter of discharge switching element 12 to the anode of diode 14 and accordingly serves as an exclusive power source wiring. The common power source wiring 3 extends from the power source terminal 21 of the connector 20 of this apparatus 31. Namely, the common power source wiring 3 is a common wiring pattern for supplying electric power to various circuits provided in the printed board 47 and accordingly serves as a common power source wiring. Similarly, the ground wiring 5 of the charge pump circuit 45 on the printed board 47 is discriminated from the common ground wiring 7. The ground wiring 5 is a wiring pattern connecting the emitter of charge switching element 13 to a lower potential end of capacitor 17 and accordingly serves as an exclusive ground wiring. The common ground wiring 7 extends from the ground terminal 22 of the connector 20 of this apparatus 31. Namely, the common ground wiring 7 is a common wiring pattern for regulating the ground potential of various circuits provided in the printed board 47 and accordingly serves as a common ground wiring.

More specifically, as shown in FIGS. 3 to 6, the power source wiring 1 and the ground wiring 5 are arranged as a surface layer pattern formed on the surface of printed board 47 on which the switching elements 12 and 13, the diode 14, and the capacitor 17 are mounted.

According to the electronic control apparatus 31 of the first embodiment, the common power source wiring 3 is formed in the second layer of the printed board 47 which is closest but one to the upper surface of the printed board 47 shown in FIG. 3. The common power source wiring 3 is connected to the power source wiring 1 of the charge pump circuit 45 via a via-hole va. The via-hole va has an impedance larger than those of these wiring patterns. Similarly, the common ground wiring 7 is formed in the third layer of the printed board 47 which is closest but two to the upper surface of the printed board 47 shown in FIG. 3. The common ground wiring 7 is connected to the ground wiring 5 of the charge pump circuit 45 via a via-hole vb. The via-hole vb has an impedance larger than those of these wiring patterns.

The power source wiring 2, formed on the surface layer of the printed board 47, connects the via-hole va to the power source wiring 1. The ground wiring 6, formed on the surface layer of the printed board 47, connects the via-hole vb to the ground wiring 5. The capacitor C (corresponding to the capacitive element) is connected between the power source wiring 2 and the ground wiring 6. The capacitor C has a function of suppressing the noises. The power source wiring 1 and the power source wiring 2 are discriminated in this explanation. However, the power source wiring 2 can be regarded as a limited portion of the power source wiring 1 adjacent to the via-hole va (i.e. an upstream end portion of the power source wiring 1). Similarly, the ground wiring 5 and the ground wiring 6 are discriminated in this explanation. However, the ground wiring 2 can be regarded as a limited portion of the ground wiring 5 adjacent to the via-hole vb (i.e. a downstream end portion of the ground wiring 5).

In FIGS. 3 to 6, like the above-described FIG. 16, the wiring pattern of the printed board 47 is indicated by hatching. Furthermore, the capacitor C, the switching elements 12 and 13, the diode 14, and the capacitor 17 are surface-mounting type components as shown in FIGS. 3 and 4. Each component is connected to the printed board 47 via a connecting terminal (indicated as a black portion). Similar explanation will be applied to the later-described other embodiments shown in FIGS. 7 and 8.

According to the electronic control apparatus 31 of the above-described first embodiment, no pulse current flows across the common power source wiring 3 and the common ground wiring 7 via the via-holes va and vb in the switching operation for turning on respective switching elements 12 and 13 of the charge pump circuit 45. The via-holes va and vb have the impedances larger than those of the wiring impedances. The pulse current flows across the capacitor C connected between two points located between respective via-holes va and vb and the charge pump circuit 45, because the wiring impedance of the capacitor C is small. As shown in FIG. 2B, due to the inherent function of the capacitor C, the current flowing from the common power source wiring 3 to the charge pump circuit 45 (i.e. 'A' point current) and the current flowing from the charge pump circuit 45 to the common ground wiring 7 (i.e. 'B' point current) can be suppressed to small values when respective switching elements 12 and 13 are turned on.

Accordingly, the first embodiment can surely suppress the steep current changes of the common power source wiring 3 and the common ground wiring 7 (as well as the external power source wiring H1 and the external ground wiring H2) which occur in response to the switching operation of the charge pump circuit 45 (more specifically, the switching operation of respective switching elements 12 and 13). As a result, it becomes possible to effectively reduce the noises giving adverse effects to the external devices or to other circuits in the electronic control apparatus 31. In other words, it is not necessary to provide any special components for noise reduction. The manufacturing costs can be reduced. According to the first embodiment, the via-hole va serves as a connecting means of the present invention and the via-hole vb serves as an additional connecting means of the present invention.

Especially, according to the electronic control apparatus 31 of the first embodiment, the impedance of the via-hole va serving as the connecting means of the present invention is 1.1 times or more the impedance of the exclusive power source wiring 1 of the charge pump circuit 45 (i.e. the impedance of the wiring connecting the emitter of discharge switching element 12 to the anode of diode 14 and to the higher potential end of capacitor C). Similarly, the impedance of the via-hole vb serving as the additional connecting means of the present invention is 1.1 times or more the impedance of the exclusive ground wiring 5 of the charge pump circuit 45 (i.e. the impedance of the wiring connecting the emitter of charge switching element 13 to the lower potential end of capacitor 17 and to the lower potential end of capacitor C). With this arrangement, it becomes possible to sufficiently reduce the noises. The noise-reduction effect can be confirmed by a general noise measuring device.

Furthermore, according to the electronic control apparatus 31 of the first embodiment, as shown in FIGS. 4 to 6, the wiring area of the exclusive power source wiring 1 of the charge pump circuit 45 is 0.5 times or less the wiring area of the common power source wiring 3. Similarly, the wiring area of the exclusive ground wiring 5 of the charge pump circuit 45 is 0.5 times or less the wiring area of the common ground wiring 7.

According to the first embodiment, numerous components can be efficiently mounted on the printed board 47. The distance between the capacitor C to each component of the charge pump circuit 45 can be shortened. The impedances of the power source wiring 1 and the ground wiring 5 can be suppressed to sufficiently small values, compared with the impedances of the via-holes va and vb.

Furthermore, the common power source wiring 3 and the ground wiring 7 are formed in the inner (second and third) layers of the printed board 47. These wirings 3 and 7 have wide wiring patterns as shown in FIGS. 5 and 6 and accordingly their wiring impedances are small. Thus, these wirings can provide the stable electric potential to each circuit in the electronic control apparatus 31.

As apparent from the foregoing, the first embodiment of the present invention provides an electronic control apparatus equipped with a drive circuit for selectively controlling electric power supply to a driving objective, wherein the drive circuit has an exclusive power source wiring discriminated from a common power source wiring supplying electric power to each circuit of the electronic control apparatus. The exclusive power source wiring and the common power source wiring are connected via a connecting means having the impedance larger than that of the exclusive power source wiring. And, a capacitive element is connected between the exclusive power source wiring and a ground wiring of the drive circuit.

The electronic control apparatus according to the first embodiment can effectively suppress a steep current change from being directly transmitted to the common power source wiring of the electronic control apparatus when the switching operation of the drive circuit is performed. The current change in the common power source wiring is moderate. The capacitive element, connected between the exclusive power source wiring and the ground wiring of the drive circuit at the downstream side of the connecting means, can supply a large current temporarily flowing in an initial condition. The current change in the common power source wiring can be suppressed.

Accordingly, the first embodiment of the present invention can effectively reduce the noises transmitted to the external devices or to other circuits of the electronic control apparatus when the switching operation of the drive circuit is performed.

Furthermore, according to the electronic control apparatus according to the first embodiment, the ground wiring of the drive circuit is an exclusive ground wiring discriminated from the common ground wiring regulating the ground potential of each circuit in the electronic control apparatus. The exclusive ground wiring and the common ground wiring are connected via additional connecting means having the impedance larger than that of the exclusive ground wiring. And, the capacitive element is connected between the exclusive power source wiring and the exclusive ground wiring.

Namely, like the power source wiring, the ground wiring of the electronic control apparatus is separated into the common ground wiring commonly provided for all of the circuits and the exclusive ground wiring exclusively provided for the drive circuit. The common ground wiring and the exclusive ground wiring are connected to each other with additional connecting means. The additional connecting means has the impedance larger than that of the exclusive ground wiring. The capacitive element is connected between the exclusive ground wiring and the exclusive power source wiring.

According to this arrangement, the electronic control apparatus can prevent a steep current change from being directly transmitted to the common ground wiring in the electronic control apparatus even when such a steep current change occurs in response to the switching operation of the drive circuit. Therefore, the current change in the common ground wiring is moderate.

When a steep current change occurs in an external wiring, the first embodiment of the present invention can surely reduce the noises which give adverse influence to the external device or to other circuits in the electronic control apparatus even if such noises occur in response to the switching operation in the drive circuit.

Figure 7:
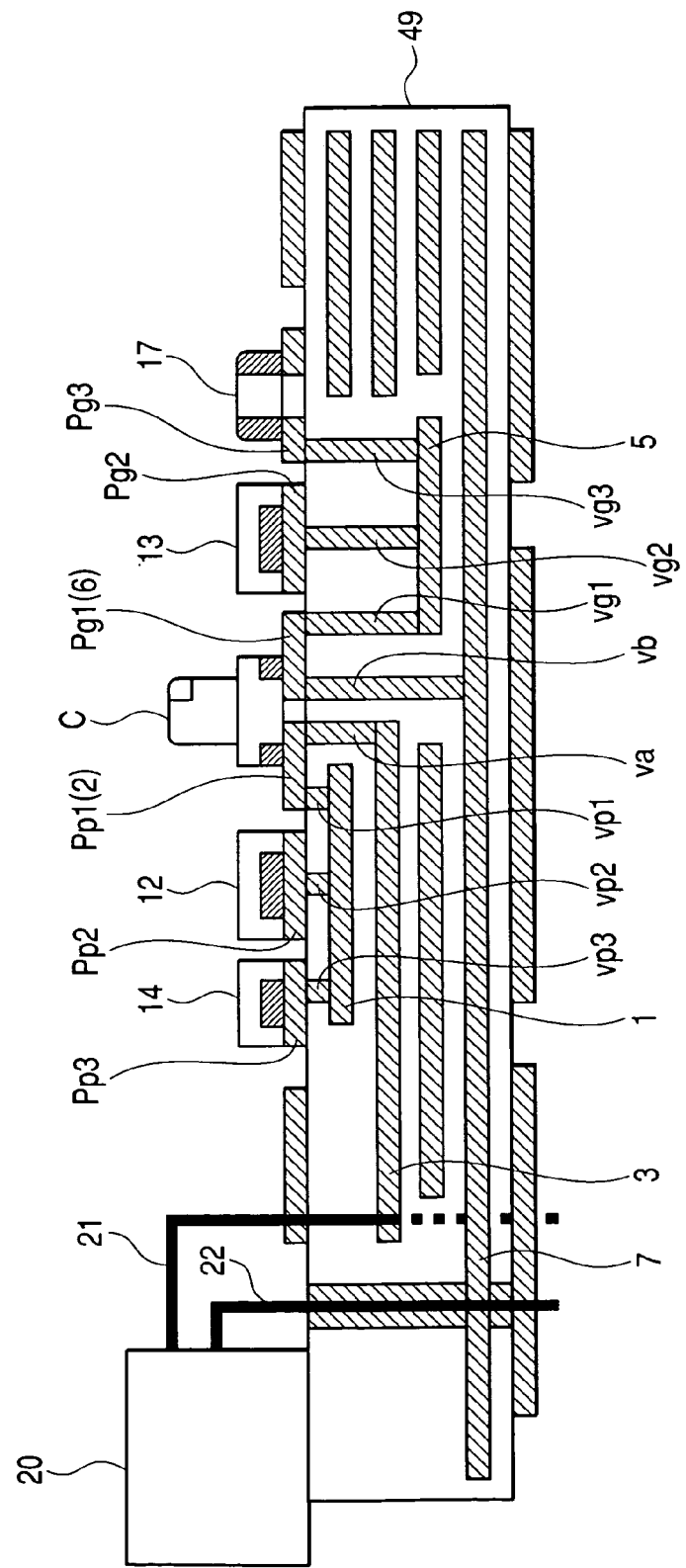
FIG. 7 is a cross-sectional view showing a printed board forming the electronic control apparatus according to a second embodiment of the present invention.

Next, a second embodiment of the present invention will be explained with reference to FIG. 7. FIG. 7 is a cross-sectional view showing a printed board 49 of an electronic control apparatus in accordance with the second embodiment of the present invention. The printed board 49 of the second embodiment is a multilayered substrate consisting of six laminated wiring layers. The components of the second embodiment shown in FIG. 7, if they are identical with those of the electronic control apparatus 31 of the first embodiment (FIGS. 1 to 6), are denoted by using the same reference numerals.

Besides the 6-layer arrangement of the printed board 49, the electronic control apparatus of the second embodiment is different from the electronic control apparatus 31 of the first embodiment in the following points. First, the exclusive power source wiring 1 and the exclusive ground wiring 5 of the charge pump circuit 45 are inner layer patterns formed in the printed board 49. In other words, the exclusive power source wiring 1 and the exclusive ground wiring 5 of the second embodiment are not formed on the surface of printed board 49 on which the switching elements 12 and 13, the diode 14, and the capacitor 17 are mounted. More specifically, the power source wiring 1 is formed in the second layer of the printed board 49. The second layer is closest to the surface layer (i.e. uppermost layer) of the printed board 49 (in other words, highest but one) as shown in FIG. 7. The ground wiring 5 is formed in the fourth layer of the printed board 49. The fourth layer is third closest to the surface layer (i.e. uppermost layer) of the printed board 49 (in other words, highest but three) as shown in FIG. 7.

The power source wiring 1 of the inner layer (i.e. second layer) is connected to three power source wirings Pp1 to Pp3 of the surface layer via three via-holes vp1 to vp3, respectively. The power source wiring Pp2 is connected to the emitter of the discharge switching element 12. The power source wiring Pp3 is connected to the anode of diode 14.

Similarly, the ground wiring 5 of the inner layer (i.e. fourth layer) is connected to three ground wirings Pg1 to Pg3 of the surface layer via three via-holes vg1 to vg3, respectively. The ground wiring Pg2 is connected to the emitter of the charge switching element 13. The ground wiring Pg3 is connected to one end of the capacitor 17.

Furthermore, according to the second embodiment, the common power source wiring 3 is formed in the third layer of the printed board 49. The third layer is second closest to the surface layer (i.e. uppermost layer) of the printed board 49 (in other words, highest but two) as shown in FIG. 7. The common power source wiring 3 is connected via the via-hole va to the power source wiring Pp1 of the surface layer. Similarly, the common ground wiring 7 is formed in the fifth layer of the printed board 49. The fifth layer is fourth closest to the surface layer (i.e. uppermost layer) of the printed board 49 (in other words, highest but four) as shown in FIG. 7. The common ground wiring 7 is connected via the via-hole vb to the ground wiring Pg1 of the surface layer.

The power source wiring Pp1 of the surface layer (corresponding to the power source wiring 2 shown in FIGS. 2 and 3) connects the via-hole va to the power source wiring 1. The ground wiring Pg1 of the surface layer (corresponding to the ground wiring 6 shown in FIGS. 2 and 3) connects the via-hole vb to the ground wiring 5. The capacitor C (corresponding to the capacitive element), having the capability of suppressing the noises, is connected between the power source wiring Pp1 and the ground wiring Pg1.

Namely, according to the second embodiment, the power source wiring 1 of FIG. 3 is replaced with the combination of the power source wiring 1 of the second layer and the power source wirings Pp1 to Pp3 of the surface layer. The ground wiring 5 of FIG. 3 is replaced with the combination of the ground wiring 5 of the fourth layer and the ground wirings Pg1 to Pg3 of the surface layer.

The electronic control apparatus of the above-described second embodiment brings substantially the same effects as those of the electronic control apparatus 31 of the first embodiment.

Figure 8:
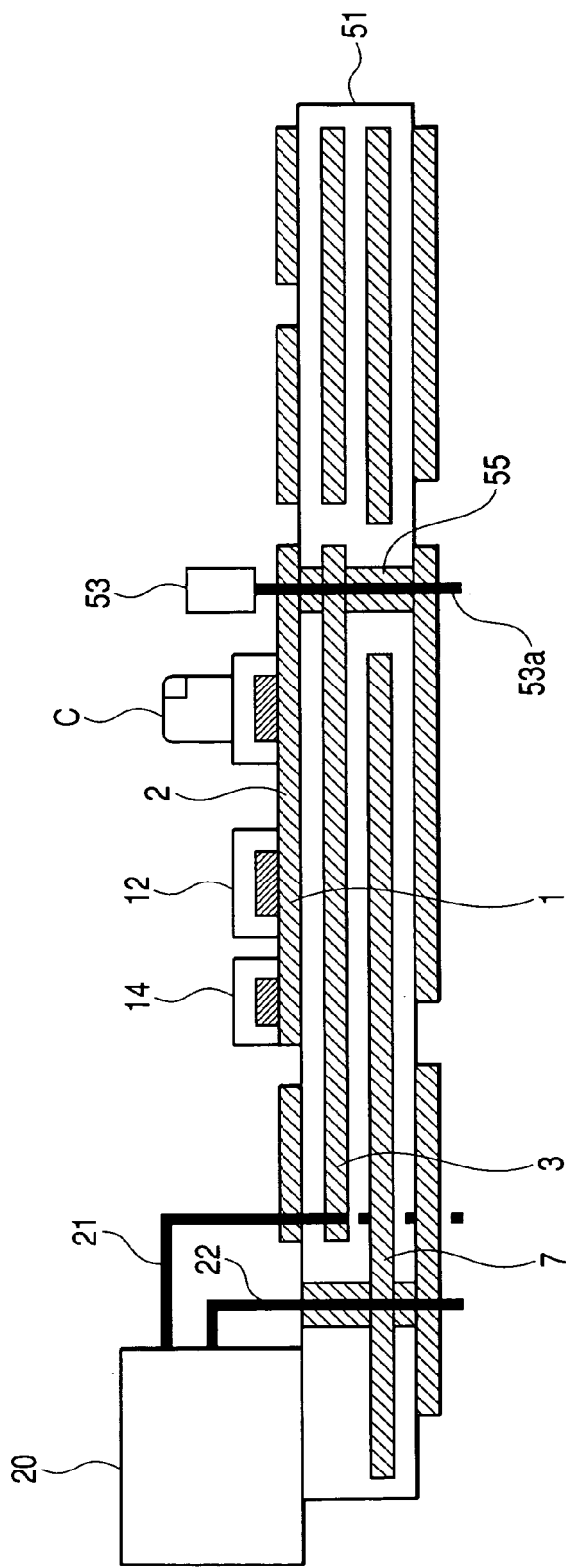
FIG. 8 is a cross-sectional view showing a printed board forming the electronic control apparatus according to a third embodiment of the present invention.

Next, a third embodiment of the present invention will be explained with reference to FIG. 8. FIG. 8 is a cross-sectional view showing a printed board 51 of an electronic control apparatus in accordance with the third embodiment of the present invention. The printed board 51 of the third embodiment is a multilayered substrate consisting of four laminated wiring layers. The components of the third embodiment shown in FIG. 8, if they are identical with those of the electronic control apparatus 31 of the first embodiment (FIGS. 1 to 6), are denoted by using the same reference numerals.

The electronic control apparatus of the third embodiment is different from the electronic control apparatus 31 of the first embodiment in the following points.

As shown in FIG. 8, according to the third embodiment, the common power source wiring 3 is connected to the exclusive power source wiring 1 of the charge pump circuit 45 via a through-hole 55. A lead terminal 53A of the lead component 53 is inserted or embedded in the through-hole 55. Especially, the lead component 53 is different from the components arranging the capacitor C and the charge pump circuit 45 and is not adversely influenced by the current changes occurring in the power source wiring.

According to the third embodiment, it is not necessary to provide any special via hole for connecting the power source wiring 1 to the common power source wiring 3. This is advantageous in realizing the space-saving and the cost-reduction of the printed board 51.

FIG. 8 omits the depiction of the exclusive ground wiring 5 for the charge pump circuit 45. However, it will be readily understood that the ground wiring 5 and the common ground wiring 7 are connected via a through-hole in which a lead terminal of a component similar to the above-described component 53 is inserted or embedded.

On the other hand, when the capacitor C is a lead component, it is possible to connect the power source wiring 1 and the ground wiring 5 of the charge pump circuit 45 to the common power source wiring 3 and the common ground wiring 7, respectively, with through-holes in which the lead terminal of the capacitor C is inserted or embedded. More specifically, when the capacitor C is a lead component, the via-holes va and vb shown in FIGS. 3 and 7 can be arranged by the through-holes in which the lead terminal of the capacitor C is inserted or embedded.

Furthermore, it is possible to connect the power source wiring 1 of the charge pump circuit 45 to the common power source wiring 3 with the through-hole in which the power source terminal 21 of the connector 20 is inserted or embedded. Similarly, it is possible to connect the ground wiring 5 of the charge pump circuit 45 to the common ground wiring 7 with the through-hole in which the ground terminal 22 of the connector 20 is inserted or embedded.

Next, a fourth embodiment of the present invention will be explained with reference to FIG. 9. The components of the fourth embodiment in FIG. 9, if they are identical with those of the first to third embodiments (FIGS. 1 to 8), are denoted by using the same reference numerals.

Figure 9:
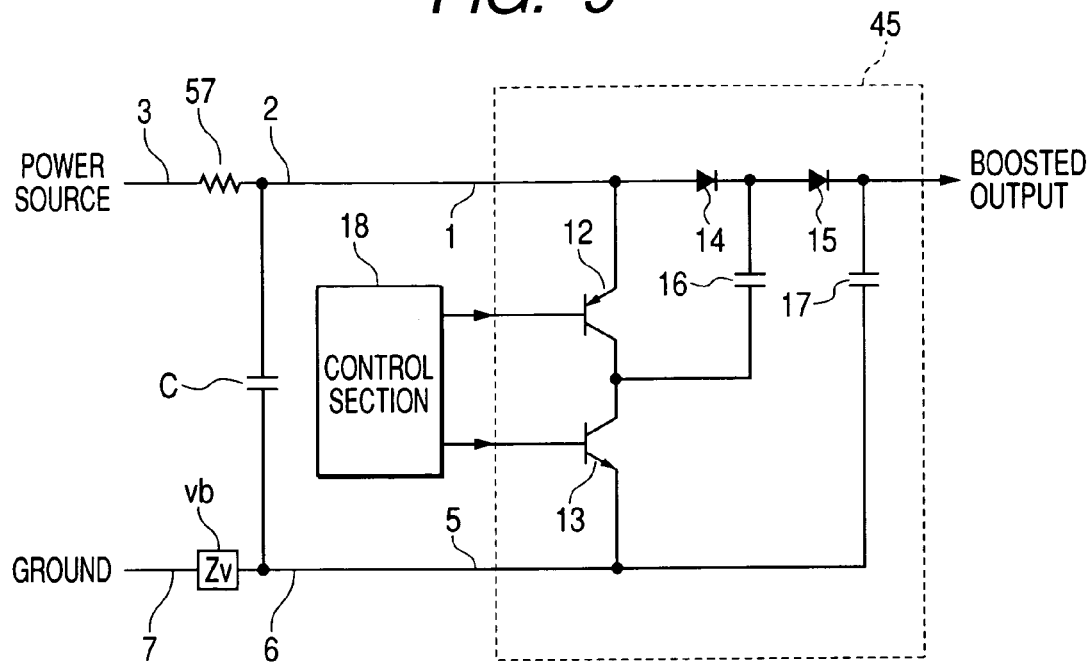
FIG. 9 is a circuit diagram showing the schematic arrangement of an electronic control apparatus in accordance with a fourth embodiment of the present invention.

As shown in FIG. 9, an electronic control apparatus of the fourth embodiment is different from the electronic control apparatuses of the first to third embodiments in that the via-hole for connecting the exclusive power source wiring 1 of the charge pump circuit 45 to the common power source wiring 3 is replaced with a resistance element 57. According to this arrangement, it is possible to set a large impedance value which is unattainable by the via-hole. This is advantageous in supplying a large and instant current to the capacitor 16. Furthermore, the adjustment of the impedance value is feasible even after the printed boards 47, 49, and 51 are accomplished.

According to the fourth embodiment, the resistance element 57 serves as the connecting means of the present invention. Furthermore, it is possible to use another resistance element for connecting the exclusive ground wiring 5 of the charge pump circuit 45 to the common ground wiring 7. Alternatively, it is possible to use only one resistance element for connecting the exclusive ground wiring 5 to the common ground wiring 7 when the exclusive power source wiring 1 and the common power source wiring 3 are connected with the via-hole va. In the latter cases, the resistance element serves as the additional connecting means of the present invention.

Next, a fifth embodiment of the present invention will be explained with reference to FIG. 10. The components of the fifth embodiment shown in FIG. 10, if they are identical with those of the first to third embodiments (FIGS. 1 to 8), are denoted by using the same reference numerals.

Figure 10:
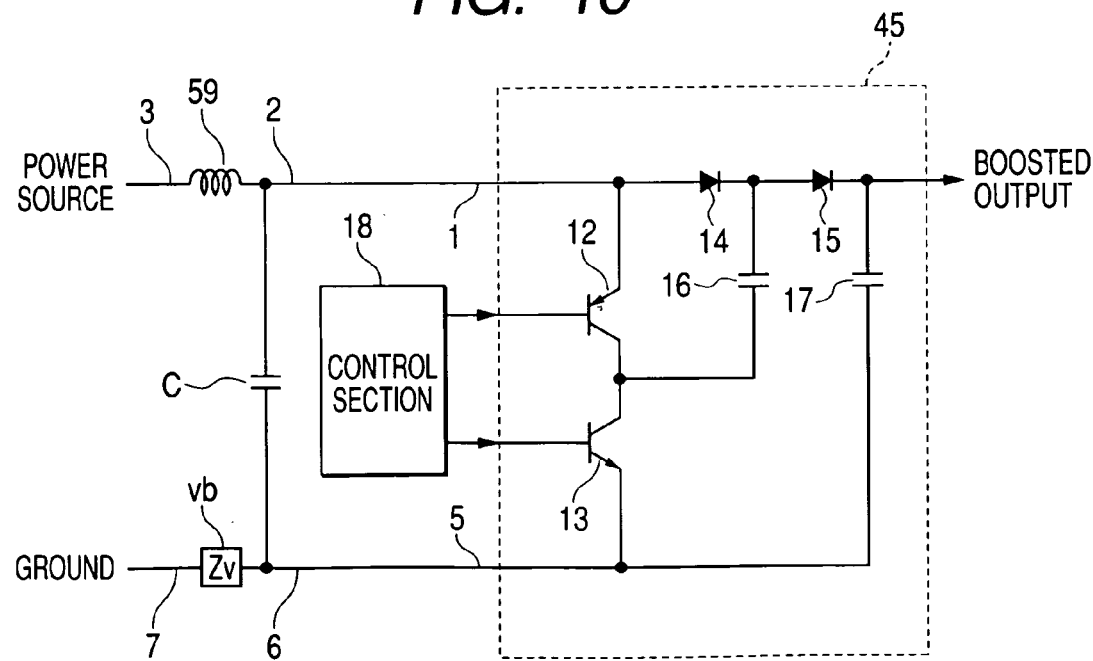
FIG. 10 is a circuit diagram showing the schematic arrangement of an electronic control apparatus in accordance with a fifth embodiment of the present invention.

As shown in FIG. 10, an electronic control apparatus of the fifth embodiment is different from the electronic control apparatuses of the first to third embodiments in that the via-hole for connecting the exclusive power source wiring 1 of the charge pump circuit 45 to the common power source wiring 3 is replaced with an inductance element (e.g. coil) 59. According to this arrangement, like the fourth embodiment, it is possible to set a large impedance value which is unattainable by the via-hole. This is advantageous in supplying a large and instant current to the capacitor 16. Furthermore, the adjustment of the impedance value is feasible even after the printed boards 47, 49, and 51 are accomplished. Furthermore, the inductance element 59 is preferably applicable in a case that the current supplied to the charge pump circuit 45 is large and accordingly the voltage drop is large.

According to the fifth embodiment, the inductance element 59 serves as the connecting means of the present invention.

Furthermore, it is possible to use another inductance element for connecting the exclusive ground wiring 5 of the charge pump circuit 45 to the common ground wiring 7. Alternatively, it is possible to use only one inductance element for connecting the exclusive ground wiring 5 to the common ground wiring 7 when the exclusive power source wiring 1 and the common power source wiring 3 are connected with the via-hole va. In the latter cases, the inductance element serves as the additional connecting means of the present invention.

In the foregoing description, the charge pump circuit 45 is explained as a drive circuit which generates the noises. However, the above-described arrangement for suppressing the noises in accordance with each embodiment is not limited to the charge pump circuit 45 and accordingly can be also applied to other drive circuits shown in FIGS. 11 to 14. The components of the arrangements shown in FIGS. 11 to 14, if they are identical with those shown in FIGS. 1 and 2, are denoted by using the same reference numerals.

Figure 11:
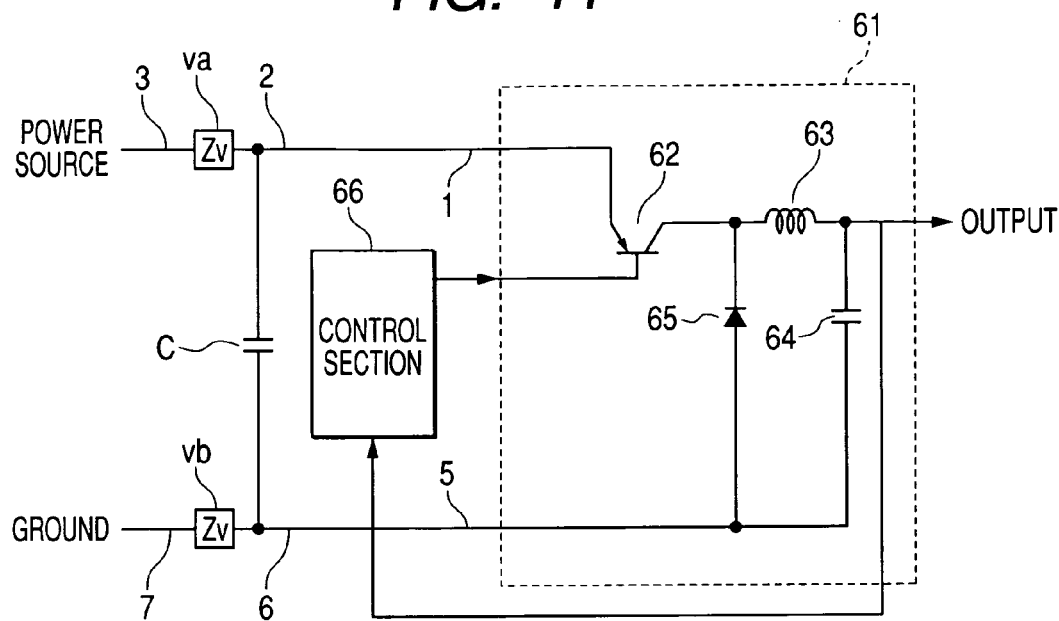
FIG. 11 is a circuit diagram showing the schematic arrangement of an electronic control apparatus including a step-down switching mode power source circuit.

FIG. 11 shows a step-down switching mode power source circuit 61 that produces the reduced voltage having a voltage value lower than the power source voltage supplied in response to the switching operation. This power source circuit 61 includes a PNP transistor 62, a smoothing circuit consisting of a choke coil 63 and a capacitor 64, and a diode 65. The PNP transistor 62 has an emitter connected to the exclusive power source wiring 1 of the circuit 61. The choke coil 63 and the capacitor 64, cooperatively constituting the smoothing circuit, is serially connected between the collector of transistor 62 and the exclusive ground wiring 5 of this power source circuit 61. The diode 65 is connected in parallel with the smoothing circuit. The transistor 62 is turned on/off in response to the drive signal supplied from the control section 66. The transistor 62 selectively controls or stops electric power supplied to the smoothing circuit consisting of the choke coil 63 and the capacitor 64. Through this switching operation, a constant voltage lower than the power source voltage (i.e. the electric potential of the power source wiring 1) is produced at the connecting point between the choke coil 63 and the capacitor 64. The control section 66 monitors the terminal voltage of the capacitor 64, and controls the duty ratio of the drive signal supplied to the transistor 62 in such a manner that the terminal voltage of the capacitor 64 is within a predetermined range.

Figure 12:
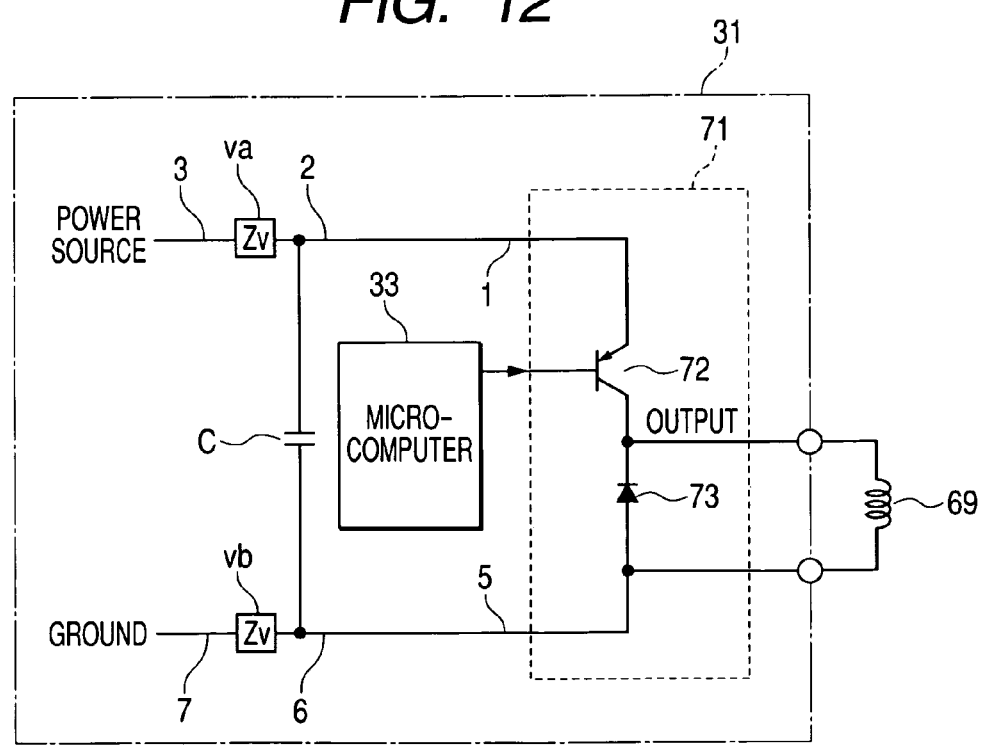
FIG. 12 is a circuit diagram showing the schematic arrangement of an electronic control apparatus including a high-side switching type electric load drive circuit.

FIG. 12 shows a high-side switching type electric load drive circuit 71 that controls an external electric load (e.g. a solenoid or other inductance load) 69 provided outside the electronic control apparatus 31. This drive circuit 71 includes a PNP transistor 72 and an arc-suppressing diode 73. The electric load 69 has one end connected to the exclusive ground wiring 5 of the circuit 71 and the other end connected to a collector of the PNP transistor 72. The PNP transistor 72 has an emitter connected to the exclusive power source wiring 1 of the circuit 71. The PNP transistor 72 serves as the switching element of the present invention. The arc-suppressing diode 73 is connected in parallel with the electric load 69. The transistor 72 is turned on/off in response to the command signal supplied from the microcomputer 33. The transistor 72 selectively controls or stops electric power supplied to the electric load 69.

Figure 13:
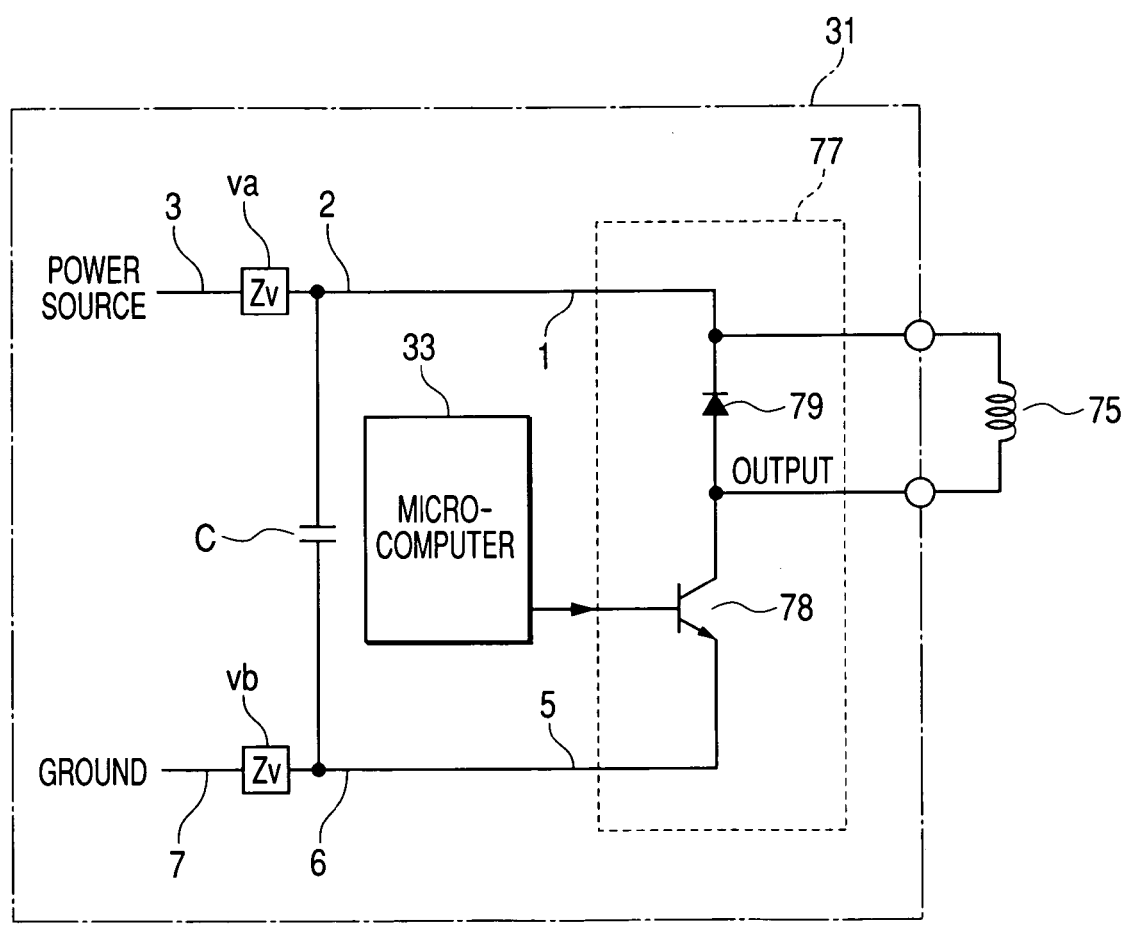
FIG. 13 is a circuit diagram showing the schematic arrangement of an electronic control apparatus including a low-side switching type electric load drive circuit.

FIG. 13 is a low-side switching type electric load drive circuit 77 that controls an external electric load (e.g. a solenoid or other inductance load) 75 provided outside the electronic control apparatus 31. This drive circuit 77 includes an NPN transistor 78 and an arc-suppressing diode 79. The electric load 75 has one end connected to the exclusive power source wiring 1 of the circuit 77 and the other end connected to a collector of the NPN transistor 78. The NPN transistor 78 has an emitter connected to the exclusive ground wiring 5 of the circuit 77. The NPN transistor 78 serves as the switching element of the present invention. The arc-suppressing diode 79 is connected in parallel with the electric load 75. The transistor 78 is turned on/off in response to the command signal supplied from the microcomputer 33. The transistor 78 selectively controls or stops electric power supplied to the electric load 75.

Figure 14:
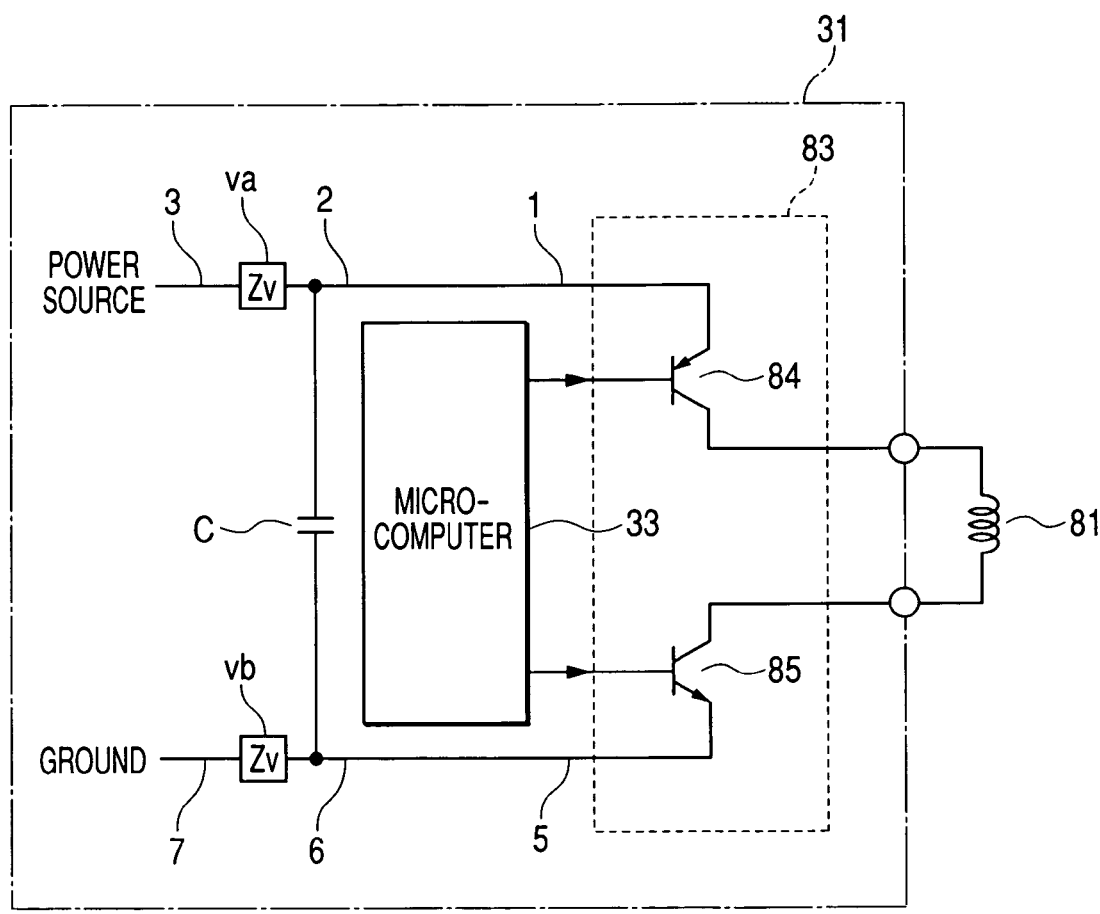
FIG. 14 is a circuit diagram showing the schematic arrangement of an electronic control apparatus including a half-bridge switching type electric load drive circuit.

FIG. 14 shows a half-bridge switching type electric load drive circuit 83 that controls an external electric load (e.g. a solenoid or other inductance load) 81 provided outside the electronic control apparatus 31. This drive circuit 83 includes a PNP transistor 84 and an NPN transistor 85. The electric load 81 has one end connected to a collector of the PNP transistor 84 and the other end connected to a collector of the NPN transistor 85. The PNP transistor 84, serving as the higher potential side switching element of the present invention, has an emitter connected to the exclusive power source wiring 1 of this circuit 83. The NPN transistor 85, serving as the lower potential side switching element of the present invention, has an emitter connected to the exclusive ground wiring 5 of this circuit 83. The transistors 84 and 85 are turned on/off in response to the command signals supplied from the microcomputer 33. The transistors 84 and 85 selectively control or stop the electric power supplied to the electric load 81.

Regarding the above-described drive circuits 61, 71, 77, and 83, it is for example preferable to connect the exclusive power source wiring 1 of the drive circuit to the common power source wiring 3 with the via-hole va and connect the exclusive ground wiring 5 of the drive circuit to the common ground wiring 7 with the via-hole vb. Furthermore, it is preferable to provide the noise-suppressing capacitor C connected between the power source wiring 2 and the ground wiring 6. The power source wiring 2, which is an end part of the power source wiring 1 positioned adjacent to the via-hole va, connects the via-hole va to the main part of the power source wiring 1. The ground wiring 6, which is an end part of the ground wiring 5 positioned adjacent to the via-hole vb, connects the via-hole vb to the main part of the ground wiring 5.

Although FIG. 14 shows the half-bridge switching type electric load drive circuit, this drive circuit can be modified into a full-bridge switching type electric load drive circuit by adding another combination of two serially connected transistors equivalent to the transistors 84 and 85. In other words, the present invention can be also applied to the full-bridge switching type electric load drive circuit.

The charge pump circuit 45 disclosed in each of the first to fifth embodiments has the capability of producing the voltage higher than the power source voltage through the above-described switching operation. In this respect, the charge pump circuit 45 can be regarded as a step-up switching mode power source circuit. For example, another step-up switching mode power source circuit can generate a high voltage by switching the power supply/stop to a toroidal coil or to a primary coil of a transformer. Therefore, the characteristic arrangements of the above-described embodiments can be equally applied to the electronic control apparatuses equipped with these other types of circuits, to effectively suppress the noises.

Furthermore, the noise-suppressing capacitive element of the present invention should have a sufficient electrostatic capacitive component. In this respect, an aluminum electrolytic capacitor, a tantalum capacitor, a ceramic capacitor, or other various types of capacitors can be used as the noise-suppressing capacitive element of the present invention.

The present invention is not limited to the above-described embodiments, and accordingly can be modified in various ways.

For example, in the electronic control apparatus of each embodiment, when the impedance of the external ground wiring H2 is very short, the noise giving adverse effect to the external device may not be produced even if a steep current change occurs in the external ground wiring H2. In such a case, it is not necessary to discriminate the ground wirings 5 and 7. In other words, it is not necessary to provide the via-hole vb, the resistance element, or the inductance element which separates the ground wiring 5 from the common ground wiring 7.

What is claimed is:

1. An electronic control apparatus comprising:
   a first circuit block that controls electric power to be supplied to a driving object based on switching on/off control, the first circuit block including power source and ground lines;
   a second circuit block arranged in said electronic control apparatus;
   common power source and ground lines that supply the electric power to the first and second circuit blocks;
   a connecting means that connects the common power source and ground lines to the power source and ground lines of the first circuit block and which connecting means has an impedance larger than that of said power source line of the first circuit block; and
   a capacitive element arranged between the connecting means and the first circuit block so as to connect the power source line and the ground line of said first circuit block with each other through said capacitive element.

2. The electronic control apparatus in accordance with claim 1, wherein:
   said electronic control apparatus is formed on a multilayered laminated printed board, and
   each of said lines is a wiring pattern of said laminated printed board.

3. The electronic control apparatus in accordance with claim 2, wherein:
   said power source and ground lines of the first circuit block are formed on a surface layer of said laminated printed board.

4. The electronic control apparatus in accordance with claim 3, wherein:
   a portion of said common power source and ground lines connected to said power source and ground lines of the first circuit block via at least said connecting means is formed in an inner layer of said laminated printed board, and
   said connecting means is a via-hole of said laminated printed board.

5. The electronic control apparatus in accordance with claim 4, wherein:
   the via-hole serving as said connecting means is a through-hole into which a lead terminal of a component is inserted in addition to lead terminals of said capacitive element and a component of said first circuit block also being inserted into said through-hole.

6. The electronic control apparatus in accordance with claim 4, wherein:
   the via-hole serving as said connecting means is a through-hole into which a lead terminal of said capacitive element is inserted.

7. The electronic control apparatus in accordance with claim 2, wherein
   a portion of said common power source and ground lines connected to said power source and ground lines of the first circuit block via at least said connecting means is formed in one layer of said laminated printed board,
   a portion of said power source and ground lines of the first circuit block connected to said common power source and ground lines via at least said connecting means is formed in another layer of said laminated printed board, and
   said connecting means is a via-hole of said laminated printed board.

8. The electronic control apparatus in accordance with claim 7, wherein:
   the via-hole serving as said connecting means is a through-hole into which a lead terminal of a component is inserted in addition to lead terminals of said capacitive element and a component of said first circuit block also being inserted into said through-hole.

9. The electronic control apparatus in accordance with claim 7, wherein:
   the via-hole serving as said connecting means is a through-hole into which a lead terminal of said capacitive element is inserted.

10. The electronic control apparatus in accordance with claim 9, wherein:

the ground line of said first circuit block is an exclusive ground line discriminated from a common ground line regulating a ground potential of said second circuit block in said electronic control apparatus, said exclusive ground line and said common ground line being connected via additional connecting means having an impedance larger than that of said exclusive ground line, and said capacitive element being connected between said exclusive power source line and said exclusive ground line.

11. The electronic control apparatus in accordance with claim 10, wherein:

said exclusive ground line is formed in a surface layer of said laminated printed board.

12. The electronic control apparatus in accordance with claim 11, wherein:

a portion of said common ground line connected to said exclusive ground line via at least said additional connecting means is formed in an inner layer of said laminated printed board, and said additional connecting means is a via-hole of said laminated printed board.

13. The electronic control apparatus in accordance with claim 12, wherein:

the via-hole serving as said additional connecting means is a through-hole into which a lead terminal of a component is inserted in addition to lead terminals of said capacitive element and a component of first circuit block also being inserted into said through-hole.

14. The electronic control apparatus in accordance with claim 12, wherein:

the via-hole serving as said additional connecting means is a through-hole into which a lead terminal of said capacitive element is inserted.

15. The electronic control apparatus in accordance with claim 10, wherein:

a portion of said common ground line connected to said exclusive ground line via at least said additional connecting means is formed in one layer of said laminated printed board, a portion of said exclusive ground line connected to said common ground line via at least said additional connecting means is formed in another layer of said laminated printed board, and said additional connecting means is a via-hole of said laminated printed board.

16. The electronic control apparatus in accordance with claim 15, wherein:

the via-hole serving as said additional connecting means is a through-hole into which a lead terminal of a component is inserted in addition to lead terminals of said capacitive element and a component of said circuit block also being inserted into said through-hole.

17. The electronic control apparatus in accordance with claim 15, wherein:

the via-hole serving as said additional connecting means is a through-hole into which a lead terminal of said capacitive element is inserted.

18. The electronic control apparatus in accordance with claim 10, wherein:

said additional connecting means is a resistance element.

19. The electronic control apparatus in accordance with claim 10, wherein:

said additional connecting means is an inductance element.

20. The electronic control apparatus in accordance with claim 10, wherein:

the impedance of said additional connecting means is 1.1 times or more the impedance of said exclusive ground line.

21. The electronic control apparatus in accordance with claim 10, wherein:

a wiring area of said exclusive ground line is 0.5 times or less a wiring area of said common ground line.

22. The electronic control apparatus in accordance with claim 2, wherein the capacitive element is formed on a layer of said laminated printed board at which elements of the first circuit block are placed.

23. The electronic control apparatus in accordance with claim 1, wherein:

the ground wiring of said first circuit block is an exclusive ground line discriminated from a common ground line regulating a ground potential of said second circuit block in said electronic control apparatus, said exclusive ground line and said common ground line are connected via additional connecting means having an impedance larger than that of said exclusive ground line, and said capacitive element is connected between said exclusive power source line and said exclusive ground line.

24. The electronic control apparatus in accordance with claim 23, wherein:

said additional connecting means is a resistance element.

25. The electronic control apparatus in accordance with claim 23, wherein:

said additional connecting means is an inductance element.

26. The electronic control apparatus in accordance with claim 23, wherein:

the impedance of said additional connecting means is 1.1 times or more the impedance of said exclusive ground line.

27. The electronic control apparatus in accordance with claim 23, wherein:

a wiring area of said exclusive ground line is 0.5 times or less a wiring area of said common ground line.

28. The electronic control apparatus in accordance with claim 1, wherein:

said connecting means is a resistance element.

29. The electronic control apparatus in accordance with claim 1, wherein:

said connecting means is an inductance element.

30. The electronic control apparatus in accordance with claim 1, wherein:

said first circuit block repetitively starts or stops electric power supply to said driving object.

31. The electronic control apparatus in accordance with claim 1, wherein:

said driving object has a capacitive component.

32. The electronic control apparatus in accordance with claim 31, wherein:

said driving object is a charging/discharging capacitor of a charge pump circuit.

33. The electronic control apparatus in accordance with claim 1, wherein:

said first circuit block is a step-up switching mode power source circuit that produces a boosted voltage higher than a power source voltage supplied via said exclusive power source line.

34. The electronic control apparatus in accordance with claim 1, wherein:

said first circuit block is a step-down switching mode power source circuit that produces a reduced voltage lower than a power source voltage supplied via said exclusive power source line.

35. The electronic control apparatus in accordance with claim 1, wherein:
said first circuit block is an electric load drive circuit that controls an electric load provided outside said electronic control apparatus which serves as said driving object.

36. The electronic control apparatus in accordance with claim 35, wherein:
one end of said electric load is connected to said exclusive power source line, and
said first circuit block supplies electric power to said electric load which electric load is also connected to a ground line of said first circuit block via a switching element.

37. The electronic control apparatus in accordance with claim 35, wherein:
one end of said electric load is connected to a ground line of said first circuit block, and
said first circuit block supplies electric power to said electric load which is also connected to said exclusive power source line via a switching element.

38. The electronic control apparatus in accordance with claim 35, wherein:
said first circuit block includes a higher potential side switching element connecting one end of said electric load to said exclusive power source wiring, and a lower potential side switching element connecting the other end of said electric load to a ground line of said first circuit block, and
said drive circuit controls electric power supply to said electric load by using said switching elements.

39. The electronic control apparatus in accordance with claim 1, wherein:
the impedance of said connecting means is 1.1 times or more the impedance of said exclusive power source wiring line.

40. The electronic control apparatus in accordance with claim 1, wherein:
a wiring area of said exclusive power source line is 0.5 times or less a wiring area of said common power source line.

41. An electronic control apparatus comprising:
a common dc power source conductor;
a common ground conductor;
at least one electronic control circuit connected to said common source and ground conductors;
an isolated dc power source conductor electrically connected to said common dc power source conductor via an isolating impedance that is of higher impedance than the impedance of said isolated source conductor;
an isolated ground conductor electrically connected to said common ground conductor via an isolating impedance that is of higher impedance than the impedance of said isolated ground conductor; and
at least one switching-type power supply circuit supplying on/off switched power to at least one additional electronic control circuit, said power supply being connected between said isolated source and ground conductors and including a capacitor also connected across said isolated source and ground conductors.

42. An electronic control apparatus as in claim 41 wherein said isolated source and ground conductors comprise surface conductors on a multi-layer printed circuit board and said isolating impedances comprise conductors passing through inter-layer vias of the printed circuit board.

43. An electronic control apparatus as in claim 41 wherein at least one of said isolated source and ground conductors comprise an internal layer conductor within a multi-layer printed circuit board and aid isolating impedances comprise conductors passing through inter-layer vias of the printed circuit board.

44. An electronic control apparatus as in claim 43 wherein both of said isolated source and ground conductors comprise internal layer conductors within said multi-layer printed circuit board.

* * * * *